(12) United States Patent
Taninaka et al.

(10) Patent No.: US 9,552,066 B2
(45) Date of Patent: Jan. 24, 2017

(54) DRIVE CONTROL APPARATUS THAT DRIVES ACTUATOR, ELECTRONIC APPARATUS THAT DRIVES ACTUATOR, AND CONTROL METHOD FOR DRIVING ACTUATOR

(71) Applicant: FUJITSU LIMITED, Kawasaki-shi, Kanagawa (JP)

(72) Inventors: Kiyoshi Taninaka, Ebina (JP); Yuichi Kamata, Isehara (JP); Akinori Miyamoto, Sagamihara (JP); Yasuhiro Endo, Ebina (JP); Akihiko Yabuki, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/976,268

(22) Filed: Dec. 21, 2015

(65) Prior Publication Data

US 2016/0103493 A1    Apr. 14, 2016

Related U.S. Application Data

(63) Continuation of application No. PCT/JP2013/067572, filed on Jun. 26, 2013.

(51) Int. Cl.
*G06F 3/01* (2006.01)
*B06B 1/02* (2006.01)
(Continued)

(52) U.S. Cl.
CPC .............. *G06F 3/016* (2013.01); *B06B 1/0246* (2013.01); *G06F 3/044* (2013.01); *H01L 41/09* (2013.01)

(58) Field of Classification Search
CPC ............ G10F 1/00; G01L 5/226; G06F 3/016;
G06F 2203/013; G06F 2203/014; G06F 2203/015
See application file for complete search history.

(56) References Cited

U.S. PATENT DOCUMENTS 8,325,144 B1    12/2012 Tierling et al.
2002/0149561 A1*  10/2002 Fukumoto .......... G01C 21/3664
                                                              345/156
(Continued)

FOREIGN PATENT DOCUMENTS

JP    2006-079135    3/2006
JP    2006-79136     3/2006
(Continued)

OTHER PUBLICATIONS

International Search Report of Int. Appl. No. PCT/JP2013/067572 dated Aug. 27, 2013 (present case), (2 pages).
(Continued)

*Primary Examiner* — Ram Mistry
(74) *Attorney, Agent, or Firm* — Fujitsu Patent Center

(57) ABSTRACT

A drive control apparatus includes a storage storing first or second waveform data representing a drive signal, and a drive controller reading the first or the second waveform data, and output the drive signal to the actuator. The first waveform data applying vibration m×Q times (Q is a natural number other than 0) and obtained by multiplying a sine wave (f1=(m/n)×f0 (m and n are mutually different natural numbers other than 0)) by a damping ratio of a vibration system to an actuator, and the second waveform data applying a vibration (m/2)×Q times (Q is a natural number other than 0) and obtained by multiplying a sine wave (a frequency f1=(m/n)×f0 (m and n are mutually different positive odd numbers)) by the damping ratio to the actuator, where f0 represents a resonant frequency of the actuator.

6 Claims, 23 Drawing Sheets

(51) Int. Cl.
 *G06F 3/044* (2006.01)
 *H01L 41/09* (2006.01)

(56) References Cited

U.S. PATENT DOCUMENTS

| | | |
|---|---|---|
| 2006/0055515 A1 | 3/2006 | Yatsu et al. |
| 2006/0119573 A1 | 6/2006 | Grant et al. |
| 2007/0146334 A1 | 6/2007 | Inokawa |
| 2008/0084384 A1 | 4/2008 | Gregorio et al. |
| 2008/0198139 A1 | 8/2008 | Lacroix et al. |
| 2009/0106655 A1 | 4/2009 | Grant et al. |
| 2009/0243997 A1 | 10/2009 | Tierling et al. |
| 2009/0284485 A1 | 11/2009 | Colgate et al. |
| 2010/0153845 A1* | 6/2010 | Gregorio ............... G06F 3/016 715/702 |
| 2010/0265191 A1 | 10/2010 | Mui et al. |
| 2010/0302184 A1 | 12/2010 | East et al. |
| 2010/0309141 A1 | 12/2010 | Cruz-Hernandez et al. |
| 2011/0074706 A1* | 3/2011 | Son ...................... G06F 3/016 345/173 |
| 2011/0102355 A1 | 5/2011 | Aono et al. |
| 2011/0148795 A1 | 6/2011 | Aono et al. |
| 2011/0163985 A1 | 7/2011 | Bae et al. |
| 2012/0025742 A1 | 2/2012 | Masahiko |
| 2012/0232780 A1 | 9/2012 | Delson et al. |
| 2012/0249462 A1 | 10/2012 | Flanagan et al. |
| 2013/0261811 A1 | 10/2013 | Yagi et al. |
| 2013/0264973 A1 | 10/2013 | Garg et al. |

FOREIGN PATENT DOCUMENTS

| | | |
|---|---|---|
| JP | 2008-130055 | 6/2008 |
| JP | 2008-521597 | 6/2008 |
| JP | 2010-506302 | 2/2010 |
| JP | 2010-506499 | 2/2010 |
| JP | 2010-146516 | 7/2010 |
| JP | 2010-287232 | 12/2010 |
| JP | 2011-507088 | 3/2011 |
| JP | 2011-175364 | 9/2011 |
| JP | 2012-020284 | 2/2012 |
| JP | 2012-135755 | 7/2012 |
| WO | 2006/071449 A1 | 7/2006 |
| WO | 2008/042745 | 4/2008 |
| WO | 2009/074826 | 6/2009 |

OTHER PUBLICATIONS

International Search Report of Int. Appl. No. PCT/JP2013/067544 dated Aug. 27, 2013 (related case), (2 pages).
USOA—Office Action mailed on Apr. 13, 2016 issued with respect to the related U.S. Appl. No. 14/976,178.
ISR—International Search Report for International Patent Application No. PCT/JP2012/064953 dated Aug. 28, 2012.
USOA—Non-Final Rejection mailed on Aug. 6, 2015 issued with respect to the related U.S. Appl. No. 14/532,447.
USOA—Final Rejection mailed on Nov. 10, 2015 issued with respect to the related U.S. Appl. No. 14/532,447.
USOA—Non-Final Rejection mailed on Jul. 6, 2016 issued with respect to the related U.S. Appl. No. 14/532,447.
USOA—Notice of Allowance mailed on Aug. 4, 2016 issued with respect to the related U.S. Appl. No. 14/976,178.
USOA—Non-Final Rejection mailed on Sep. 28, 2016 issued with respect to the related U.S. Appl. No. 14/976,178.

\* cited by examiner

LRA (VCM)
(linear resonant actuator)
(voice coil motor)

LRA (PIEZO)

$f_0 = 175 Hz$ $F = 0.01 \sin 2\pi f_1 t \quad f_1 = 350 Hz$ $m = 2, n = 1$

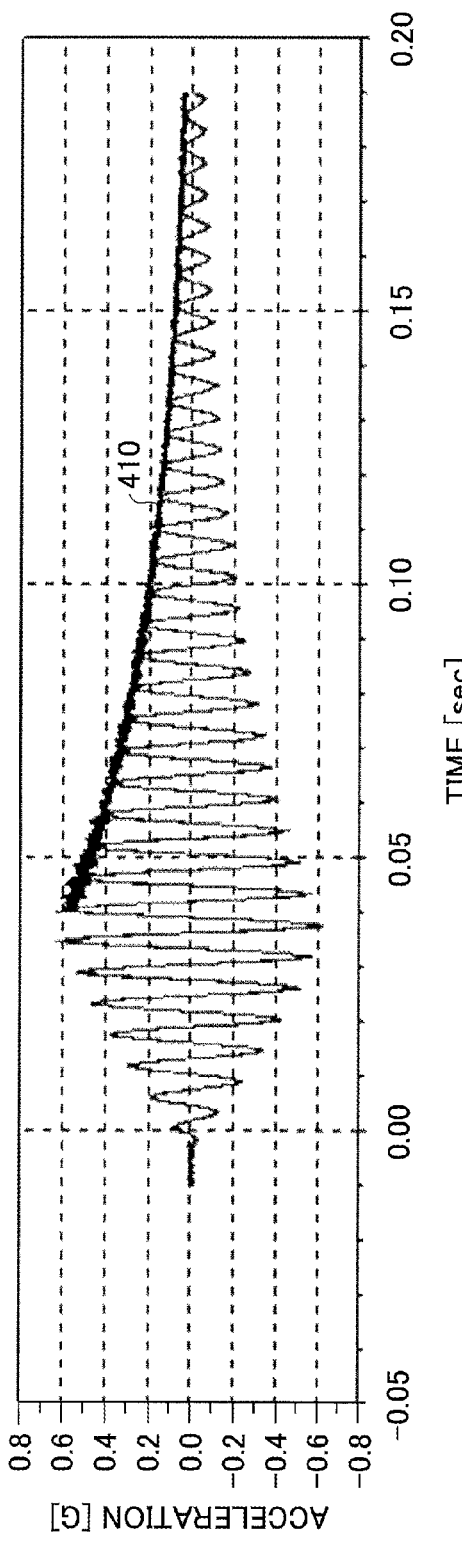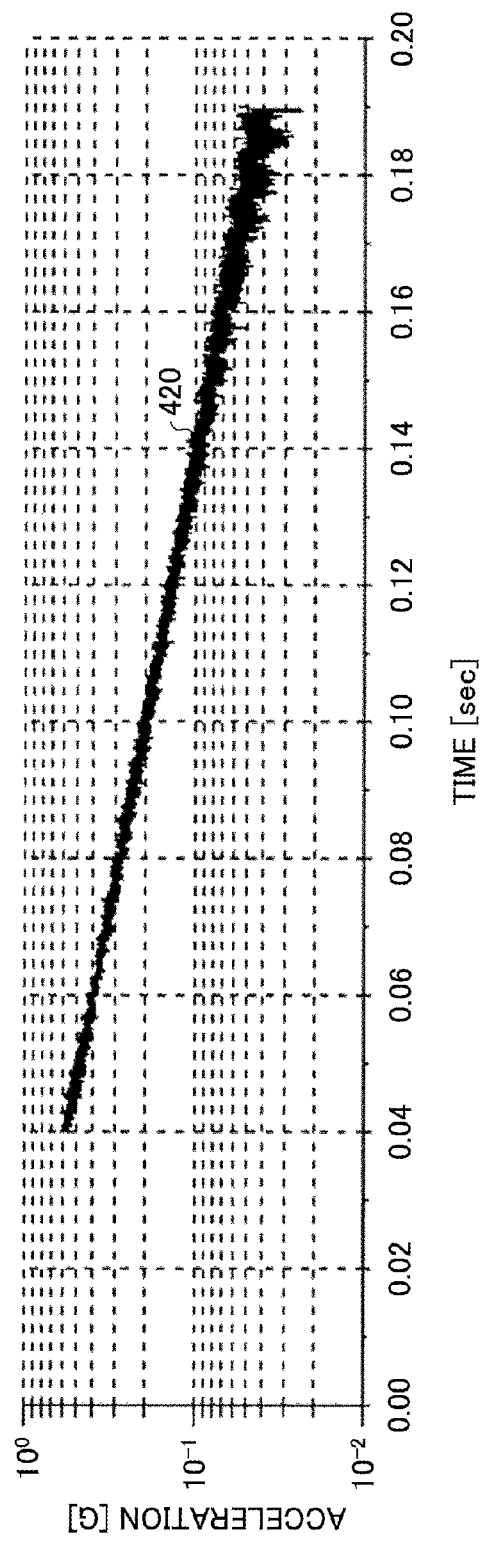

DRIVE CONTROL APPARATUS THAT DRIVES ACTUATOR, ELECTRONIC APPARATUS THAT DRIVES ACTUATOR, AND CONTROL METHOD FOR DRIVING ACTUATOR

CROSS-REFERENCE TO RELATED APPLICATIONS

This application is a continuation application of International Application PCT/JP2013/067572 filed on Jun. 26, 2013 and designated the U.S., the entire contents of which are incorporated herein by reference.

FIELD

The disclosures discussed herein relate to a drive control apparatus, an electronic apparatus, and a drive control method.

BACKGROUND

Related art electronic apparatuses include a flat touch panel as an input unit. Such a touch panel is configured to receive contact with the touch panel as input operations but does not provide users with tactile senses according to different input operations. The related art touch panel has thus been desired to incorporate a device capable of providing users with tactile senses according to different input operations.

To provide tactile senses according to the different input operations, attempts have been made to utilize vibrations generated by an LRA (linear resonant actuator). Further, Japanese Laid-open Patent Publication No. 2012-20284 (Patent Document 1) proposes an example of a technology for driving the LRA, and a dedicated IC (an integrated circuit) for controlling a tactile presenting device.

However, the vibrations generated by the LRA do not immediately stop even if a user stops inputting, and hence, the vibrations produced by the LRA may fail to represent quick responding tactile senses generated by a user pressing a metal dome button. Moreover, Patent Document 1 proposes an example of a vibration control unit configured to input an antiphase signal immediately after the input by the LRA has been stopped; however, a more satisfactory control effect may be required. The related art technology may thus require distinctively differentiated tactile senses according to different types of operations.

RELATED ART DOCUMENTS

Patent Document

Patent Document 1: Japanese Laid-open Patent Publication No. 2012-20284

SUMMARY

Hence, it is desirable to provide a drive control apparatus, an electronic apparatus, and a drive control method capable of providing tactile senses according to different operations.

According to an aspect of an embodiment, there is provided a drive control apparatus that includes a storage configured to store one of first waveform data and second waveform data, the first waveform data representing a drive signal applying vibration m times to an actuator, the drive signal being obtained by multiplying a sine wave by a damping ratio of a vibration system implementing the actuator, the sine wave satisfying a frequency $f1=(m/n) \times f0$ (m and n are mutually different natural numbers other than 0), the second waveform data representing a drive signal applying a vibration $(m/2) \times Q$ times (Q is a natural number other than 0) to the actuator, the drive signal being obtained by multiplying a sine wave by a damping ratio of the vibration system implementing the actuator, the sine wave satisfying a frequency $f1=(m/n) \times f0$ (m and n are mutually different positive odd numbers), wherein $f0$ represents a resonant frequency of the actuator; and a drive controller configured to read one of the first waveform data and the second waveform data stored in the storage, and output the drive signal corresponding to the read one of the first waveform data and the second waveform data to the actuator.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

FIG. 21A is a diagram illustrating damping of the acceleration of the free vibration;

FIG. 21B is a diagram illustrating damping of the acceleration of the free vibration;

DESCRIPTION OF EMBODIMENTS

The following describes preferred embodiments with reference to the accompanying drawings.

First Embodiment

Figure 1B:
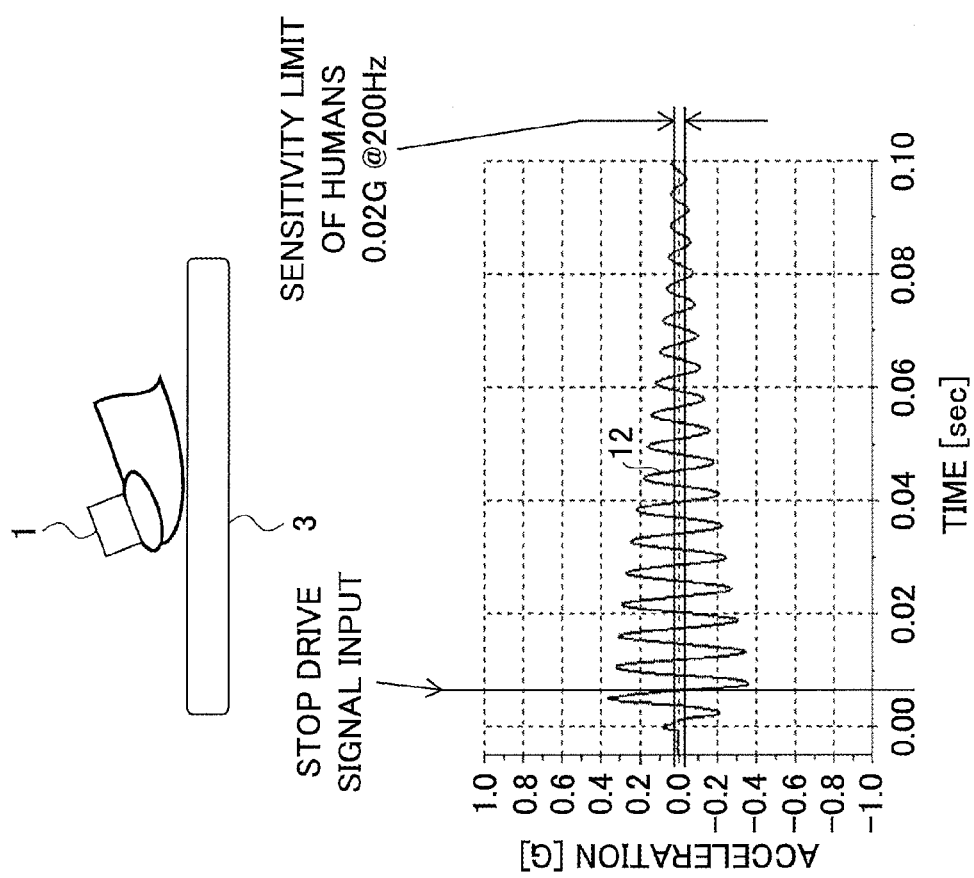
FIG. 1B is a diagram illustrating an outline of a first embodiment.
Figure 1A:
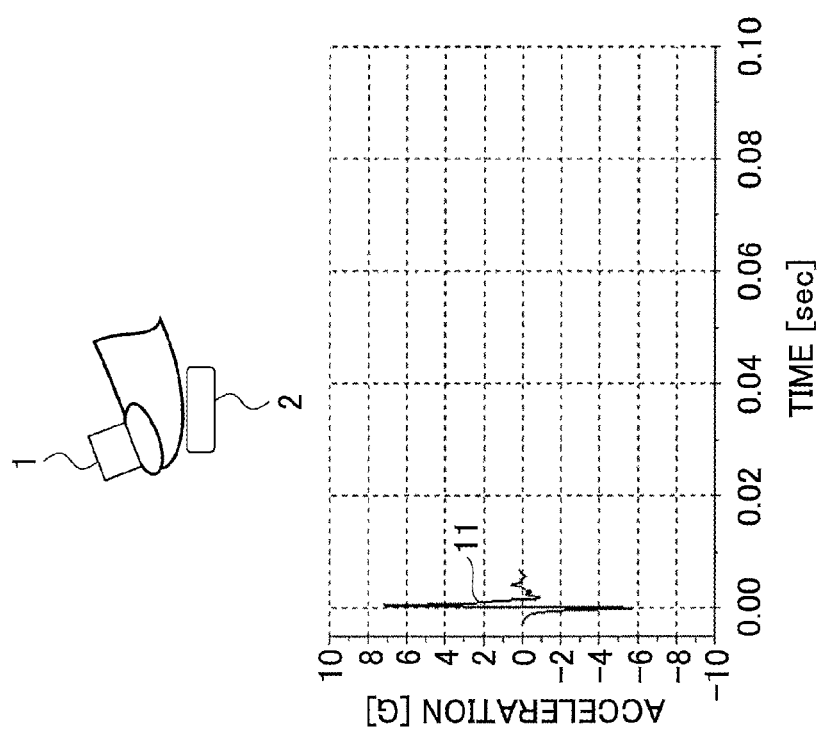
FIG. 1A is a diagram illustrating an outline of a first embodiment.

First, an outline of a first embodiment is described with reference to FIGS. 1A and 1B. FIGS. 1A and 1B are diagrams illustrating an outline of the first embodiment.

FIG. 1A is a diagram illustrating a waveform 11 of acceleration of vibrations generated by pressing a button 2 with a human finger to which an accelerometer 1 is attached. FIG. 1B is a diagram illustrating a waveform 12 of acceleration of vibrations generated by touching a touch panel 3 with a human finger to which an LRA (linear resonant actuator) is attached. The button 2 illustrated in FIG. 1 may, for example, be a metal dome button. Note that the button 2 and the touch panel 3 are attached to an electronic apparatus.

The vibration illustrated by the waveform 11 rapidly dampens in one to several periods. By contrast, the vibration illustrated by the waveform 12 continues until free vibration by a natural frequency of LRA dampens after the drive signal being supplied have been stopped. In the following illustration, the free vibration by a natural frequency of LRA continues after the drive signals being supplied has been stopped is called residual vibration.

Figure 2:
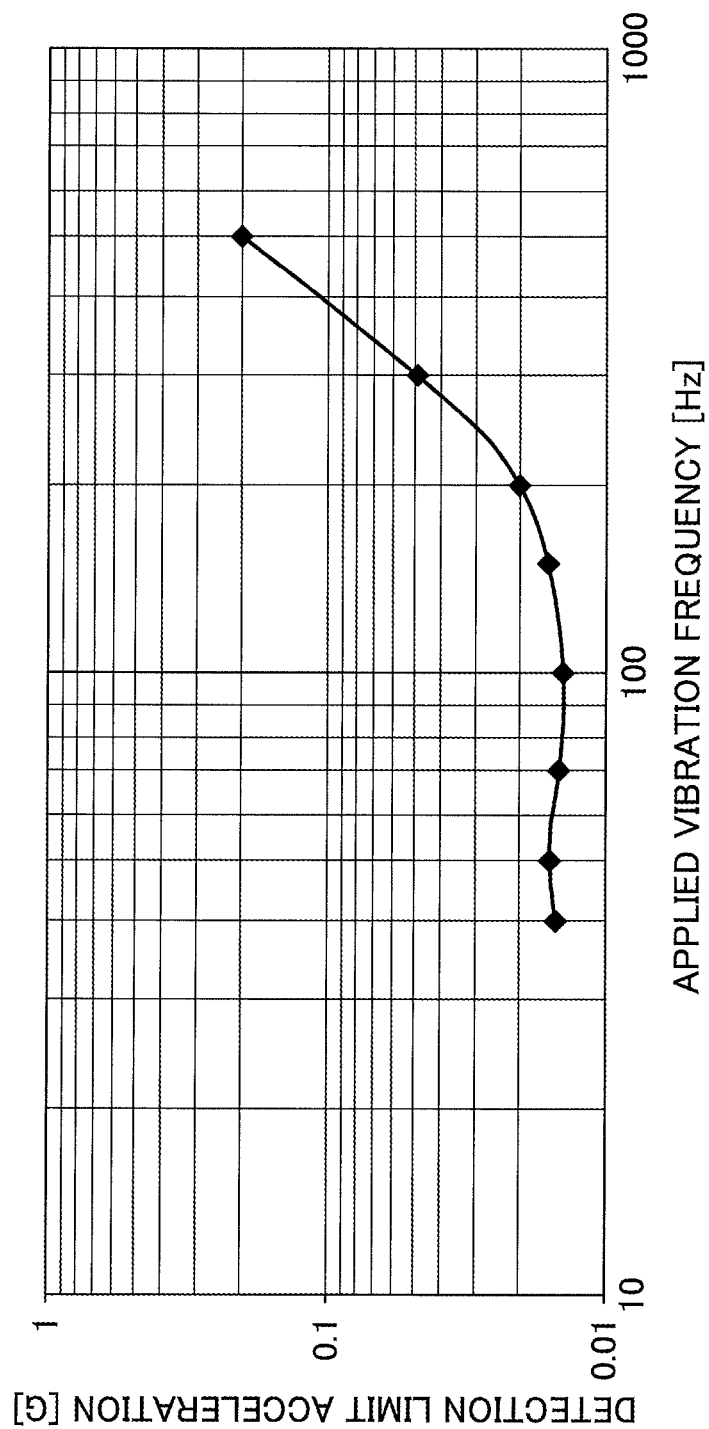
FIG. 2 is a diagram illustrating sensitivity of a sensory organ of humans.

Note that human fingers generally fail to feel or sense vibrations when the acceleration of vibrations reaches 0.02 G or less at the vibration frequency of 200 Hz. The vibration frequency represents the number of vibrations per second. The acceleration of vibration represents a change in the vibration velocity per unit time. FIG. 2 is a diagram illustrating sensitivity of an acceleration sensing organ (or an acceleration sensory receptor) of humans. Note that acceleration sensory receptors of humans correspond to Pacinian corpuscles. Pacinian corpuscles are one of the four major types of mechanoreceptors mainly observed in the skin.

That is, in the waveform 11, the finger fails to sense the vibrations within 0.01 s because the vibration acceleration reaches 0.02 G or less within 0.01 s. By contrast, in the waveform 12, 0.1 s is required until the vibration acceleration reaches 0.02 G or less so that the finger continues to sense the vibrations until 0.1 s has elapsed. Accordingly, humans will sense or feel the vibrations illustrated by the waveform 11 and the vibrations illustrated by the waveform 12 as completely different tactile senses.

According to this embodiment, the vibrations rapidly damping in one to several periods are generated by controlling the residual vibrations to express a click feeling.

The first embodiment focuses on the fact that the residual vibrations are not generated after the vibrations of the LRA 140 stop in one to several periods by supplying to LRA 140 a drive signal that satisfies a specific condition, and supplying the drive signal satisfying such a specific condition to the LRA 140.

Figure 3:
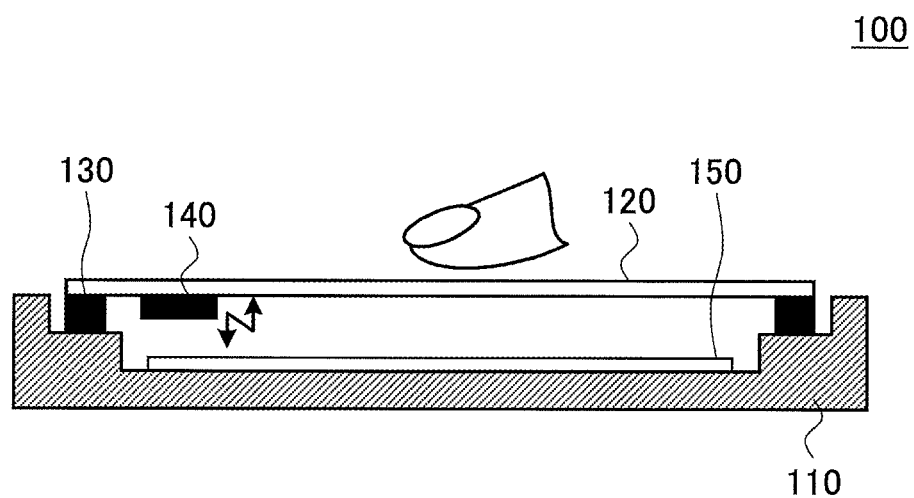
FIG. 3 is a diagram illustrating an electronic apparatus of the first embodiment.

The following describes an outline of a first embodiment with reference to FIG. 3. FIG. 3 is a diagram illustrating an electronic apparatus of the first embodiment.

The electronic apparatus of the first embodiment may be any apparatus insofar as the apparatus includes a touch panel with a display function, and an input function serving as an input unit. Examples of such an electronic apparatus include smartphones, tablet computers, and mobile information terminals.

The electronic apparatus 100 of the first embodiment includes a housing 110, a touch panel 120, a double-sided tape 130, an LRA 140, and a substrate 150.

In the electronic apparatus 100, the touch panel 120 is attached to the housing 110 with the double-sided tape 130. The LRA 140 is attached to a housing-side face of the touch panel 120. The LRA 140 is composed of a vibration system having a predesigned resonant frequency and an actuator. The LRA 140 serves as a vibration device configured to produce vibrations by being driven at the resonant frequency, and the vibrating quantity may change according to amplitudes of the drive waveform. The details of the LRA 140 will be described later. Note that in the first embodiment, the LRA 140 is an example of a vibrator. However, the vibrator is not limited to the LRA, and may be any vibrator insofar as the vibrator includes a resonator and a vibration actuator.

The substrate 150 is disposed inside the housing 110. The substrate 150 implements a drive control apparatus configured to drive the LRA 140 and a driver IC configured to output a drive signal to the LRA 140.

In the electronic apparatus 100 of the first embodiment, when a user's finger touches the touch panel 120, the sensed finger's touch causes the drive control apparatus implemented in the substrate 150 to drive the LRA 140, and the vibrations of the LRA 140 are propagated to the touch panel 120.

Note that the electronic apparatus 100 may simply include the touch panel 120 and the input unit, and hence, the electronic apparatus 100 may be an apparatus that is installed in a specific place such as an ATM (automatic teller machine).

Figure 4A:
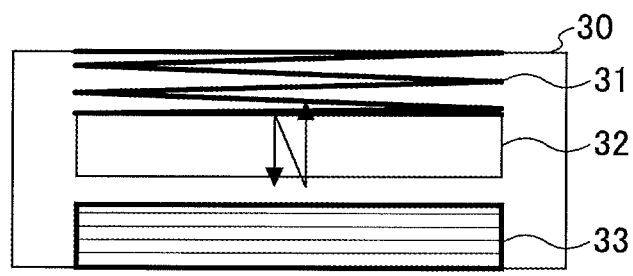
FIG. 4A is a diagram illustrating an example of an LRA (linear resonant actuator)
Figure 4B:
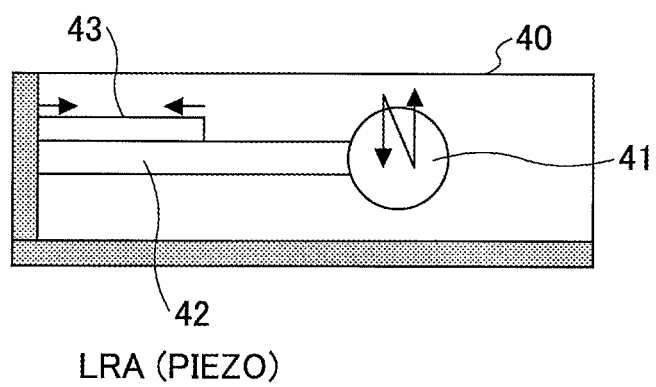
FIG. 4B is a diagram illustrating an example of an LRA.

The following describes an outline of a first embodiment with reference to FIGS. 4A and 4B. FIGS. 4A and 4B are diagrams illustrating an example of the LRA. FIG. 4A is a diagram illustrating an example of the LRA having a voice coil, and FIG. 4B is an example of the LRA having a piezoelectric element.

The LRA 30 illustrated in FIG. 4A includes a spring 31, a magnet 32, and a voice coil 33. In the LRA 30, when k represents the spring constant of the spring 31, and m represents mass of the magnet 32, the natural frequency f0 is expressed by the following formula (1).

$$f_0 = \frac{1}{2\pi}\sqrt{\frac{k}{m}} \quad (1)$$

The LRA 40 illustrated in FIG. 4B includes a weight 41, a magnet 42, and a piezoelectric element 43. In the LRA 40, when m represents the mass of the weight 41, E represents Young's modulus of the beam 42, I represents the area moment of inertia of the beam 42, and L represents the length of the beam 42, the natural frequency f0 is expressed by the following formula (2).

$$f_0 \approx \frac{1}{2\pi}\sqrt{\frac{3EI}{mL^3}} \quad (2)$$

The LRA 140 of the first embodiment may be the LRA 30 having the voice coil, or the LRA 40 having the piezoelectric element 43.

Figure 5:
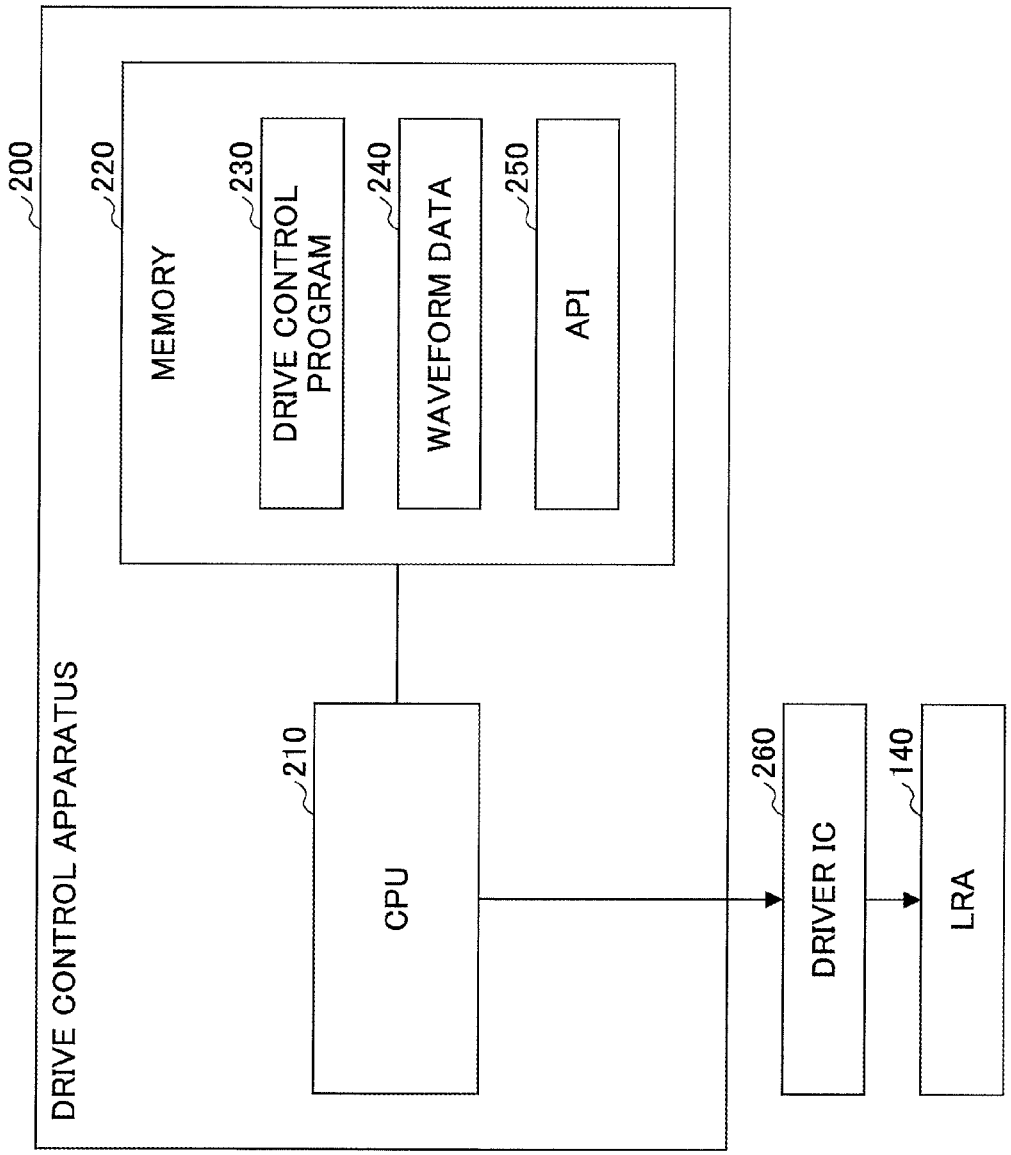
FIG. 5 is a diagram illustrating a drive control apparatus of the first embodiment.

Next, an illustration is given, with reference to FIG. 5, of a drive control apparatus implemented in the substrate 150 included in the electronic apparatus 100 of the first embodiment. FIG. 5 is a diagram illustrating a drive control apparatus of the first embodiment.

The drive control apparatus 200 of the first embodiment includes a CPU (central processing unit) 210, and a memory 220. The CPU 210 reads a drive control program 230 stored in a memory 220 and executes the read drive control program 230 to perform a later-described drive process of the LRA 140. The memory 220 includes a first storage area storing the drive control program 230 used for driving the LRA 140, and a second area storing waveform data 240, and a third area storing an API (application programming interface) 250 providing tactile senses.

The drive control program 230 causes the CPU 210 to execute a drive control process of the LRA 140. The waveform data 240 represent drive waveform data generated in advance in order to provide a click feeling due to vibrations generated by the LRA 140. The details of the waveform data 240 will be described later. The API 250 is activated by the drive control program 230 to perform various kinds of processes for providing the tactile senses. In the example of FIG. 5, the API 250 is stored in the memory 220; however, the API 250 may be stored in another memory implemented in the substrate 150.

Figure 6:
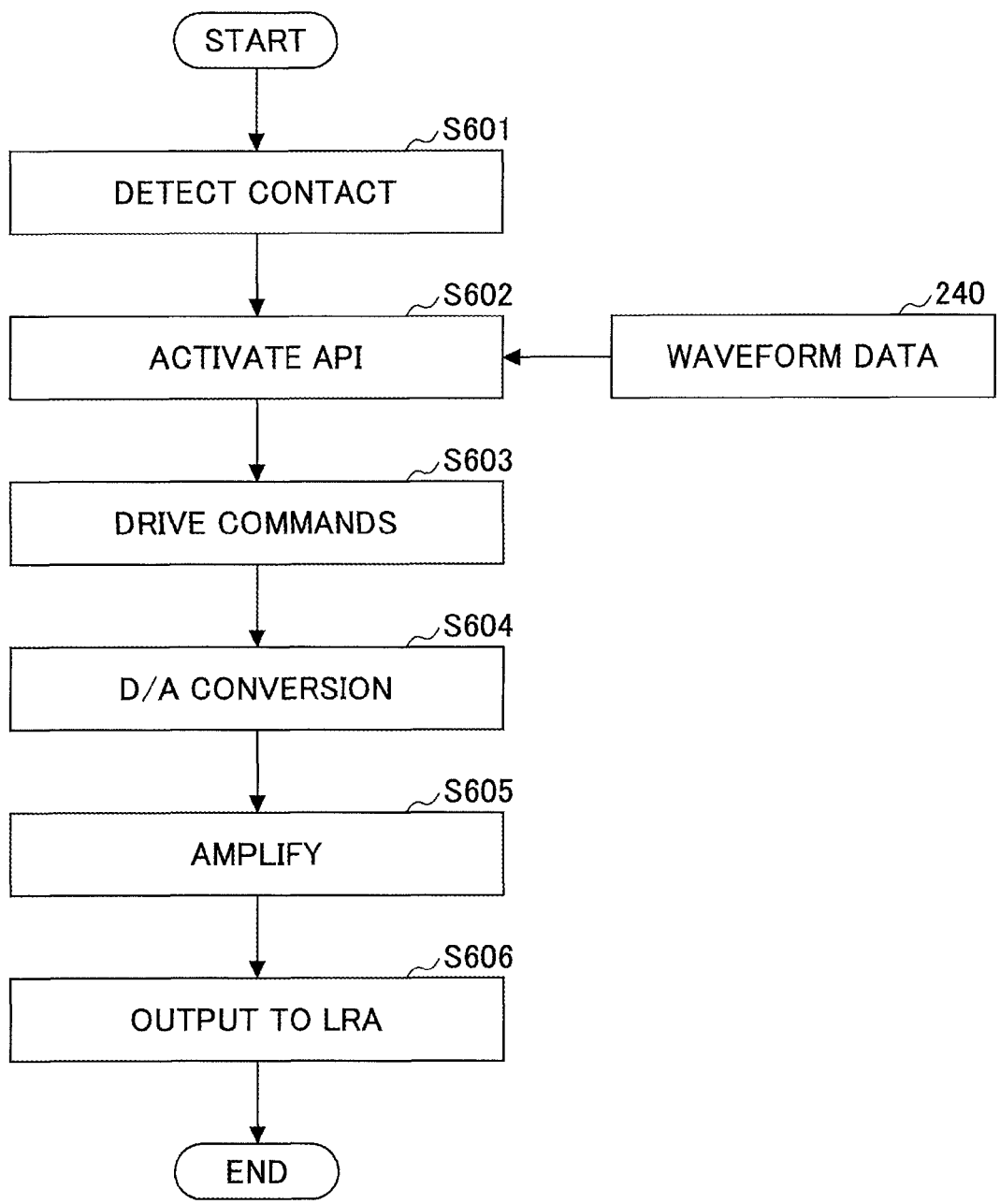
FIG. 6 is a flowchart illustrating a drive process of the LRA driven by the drive control apparatus of the first embodiment.

FIG. 6 is a flowchart illustrating the drive process of the LRA 140 driven by the drive control apparatus 300 of the first embodiment.

When the drive control apparatus 200 of the first embodiment detects contact with respect to the touch panel 120 (step S601), the drive control apparatus 200 activates the API 250 (step S602). Specifically, the drive control apparatus 200 is allowed to activate the API 250 when detecting the contact with respect to a button displayed on the touch panel 120.

The API 250 reads the waveform data 240 stored in the memory 220, and outputs drive commands corresponding to the waveform data 240 to a driver IC 260 (step S603). The driver IC 260 receives the drive commands, performs a D/A (digital to analog) conversion on the waveform data 240 (step S604), and amplifies the converted result by an amplifier or the like (step S605). The driver IC 260 outputs the amplified signal to the LRA 140 (step S606).

The following illustrates the waveform data 240 of the first embodiment. The waveform data 240 of the first embodiment represents a waveform of the drive signal that satisfies a specific condition to stop residual vibrations.

The drive signal that satisfies the specific condition constitutes a signal of a frequency f1 expressed by "f1=(m/n)×f0 (m and n are natural numbers other than 0, and m≠n)" that vibrates the LRA 140 m times, where f0 represents the natural frequency (hereinafter called a "resonant frequency") of the LRA 140.

Figure 7:
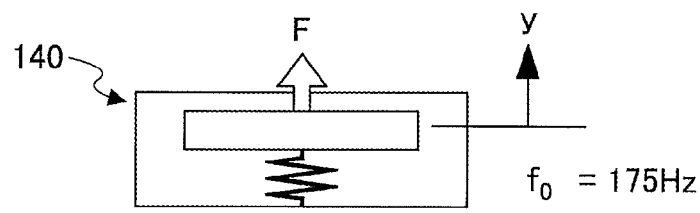
FIG. 7 is a diagram illustrating an example of the LRA.
Figure 8:
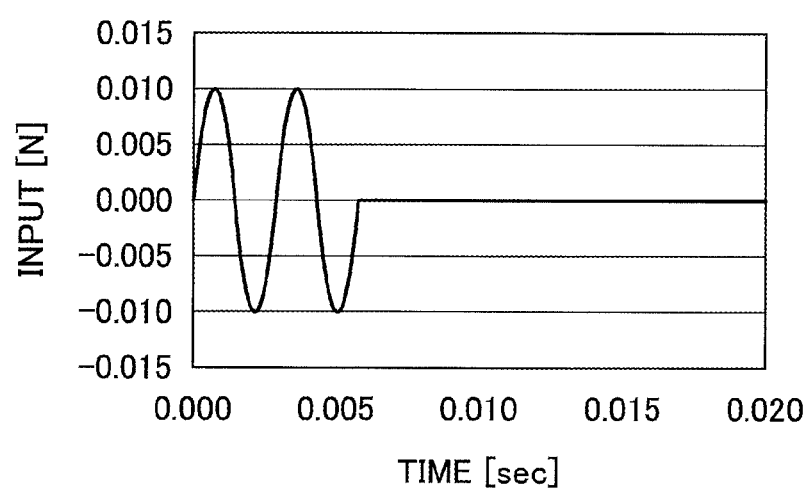
FIG. 8 is a diagram illustrating an example of a drive signal of the LRA of the first embodiment.

FIG. 7 is a schematic diagram illustrating an example of the LRA 140 of the first embodiment, and FIG. 8 is a diagram illustrating the drive signal of the LRA 140 of the first embodiment.

The LRA 140 of the first embodiment includes, as illustrated in FIG. 7, the resonant frequency of f0=175 Hz, the weight 41 of 1.5 g, and the spring constant supporting the weight 41 of 1813.5 N/m.

The drive signal of the first embodiment has a frequency f1 represented by "f1=2/1×175=350 Hz, where m=2, and n=1 are applied". When the frequency is f1, the drive signal F obtains a waveform illustrated in FIG. 8. In the example of FIG. 8, the drive signal is F=0.01 sin 2π f1t. Since m=2 is applied in the drive signal F of FIG. 8, the drive signal F is a sine wave of two periods.

In this embodiment, data indicating the drive signal F illustrated in FIG. 8 are stored as the waveform data 240 in the memory 220. The waveform data 240 may, for example, include a value of the frequency f1 of the drive signal F, values of the amplitude and phase, values of m and n, and the like. Further, the waveform data 240 may serve as data indicating the waveform itself of the drive signal F.

In this embodiment, the frequency f1 of the drive signal F may preferably be set to have an error being 1% or less with respect to m/n×f0. When the frequency f1 is set as above, the vibration acceleration reaches 0.02 G or less, which is the lower sensitivity limit of humans and is not detected by humans. Hence, the click feeling will not be disrupted.

The drive control apparatus 200 of the first embodiment reads the waveform data 240 illustrating the drive signal F by the API 250 in step S603 of FIG. 6, and outputs the drive commands corresponding to the waveform data 240 to the driver IC 260. The driver IC 260 performs the D/A conversion on the waveform data 240, amplifies the converted result, and outputs the amplified signal to the LRA 140.

An illustration is given of an example of the drive control apparatus 200 of the first embodiment in which the drive signal F is supplied to the LRA 140.

When the drive signal F is supplied to the LRA 140, harmonic force of the frequency f1 is generated by the actuator, for example the LRA 140, and forced vibration of frequency f1 and free vibration of frequency f0 are excited simultaneously. Thus, the displacement of the LRA 140 becomes a synthesized wave of the forced vibration and the free vibration.

Figure 9A:
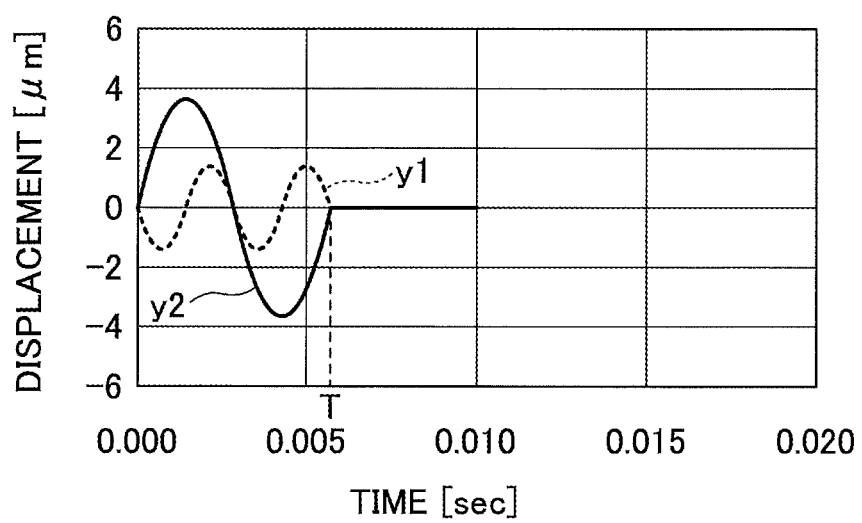
FIG. 9A is a diagram illustrating displacement of the LRA.
Figure 9B:
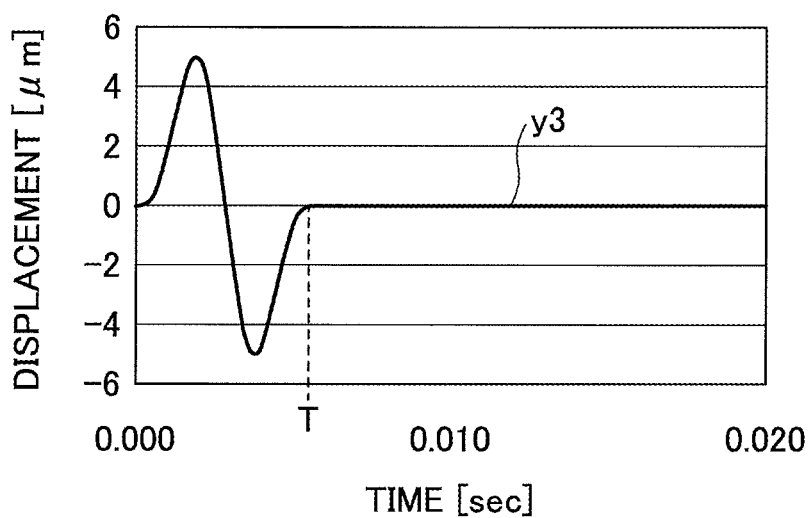
FIG. 9B is a diagram illustrating displacement of the LRA.

FIGS. 9A and 9B are diagrams illustrating examples of the displacement of the LRA 140. FIG. 9A is a first diagram illustrating an example of the displacement, and FIG. 9B is a second diagram illustrating another example of the displacement.

In FIG. 9A, a waveform indicated by a broken line represents a forced vibration component y1 of the vibration displacement that is obtained by supplying the drive signal F to the LRA 140, and a waveform indicated by a solid line represents a free vibration component y2. A response displacement y3 obtained by supplying the drive signal F to the LRA 140 is a synthesized wave of the forced vibration component y1 and the free vibration component y2.

FIG. 9B is a diagram illustrating an example of the response displacement y3. The response displacement y3 becomes 0 at a timing T where the drive signal F becomes 0.

The vibrations of the LRA 140 are stopped at the timing T where the drive signal F becomes 0 because the vibration velocity of the LRA 140, and the vibration acceleration become 0.

Figure 10A:
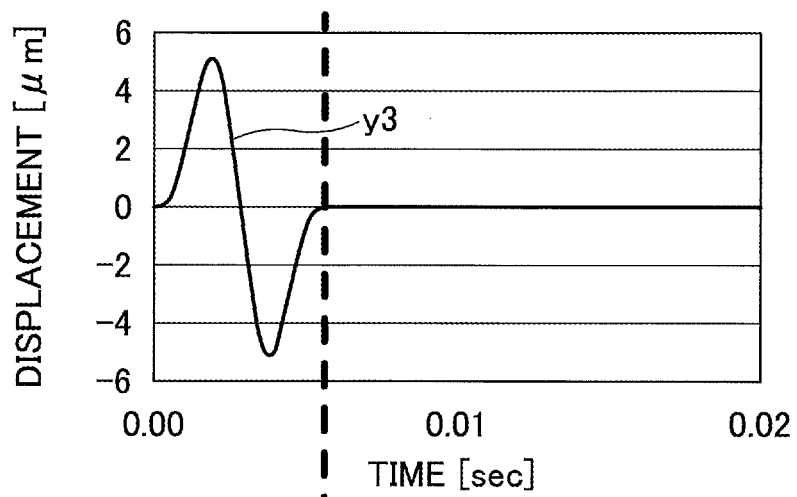
FIG. 10A is a diagram illustrating an example of vibration displacement, vibration velocity, and vibration acceleration of the LRA.
Figure 10B:
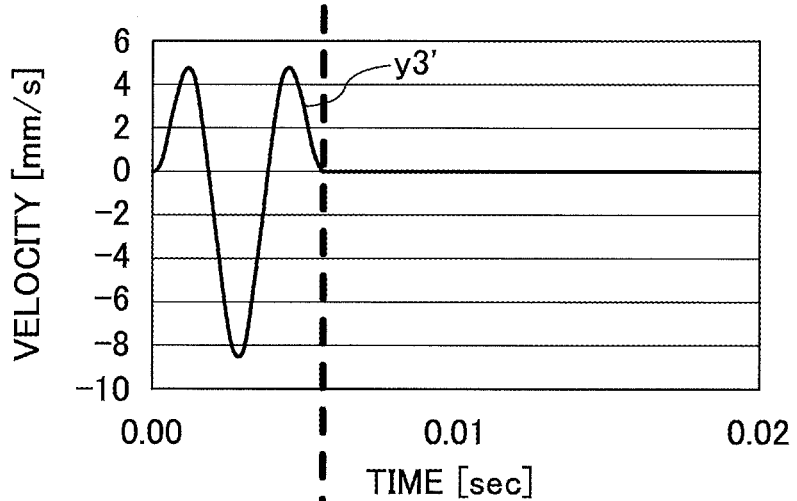
FIG. 10B is a diagram illustrating an example of vibration displacement, vibration velocity, and vibration acceleration of the LRA.
Figure 10C:
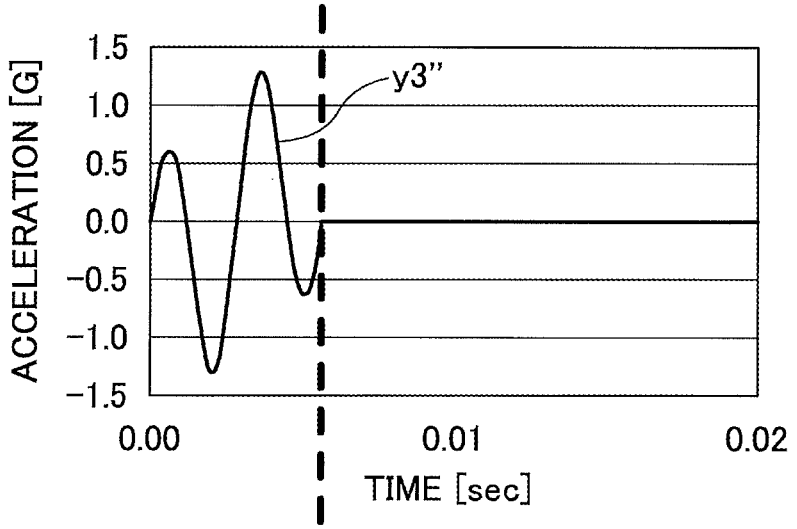
FIG. 10C is a diagram illustrating an example of vibration displacement, vibration velocity, and vibration acceleration of the LRA.

FIGS. 10A, 10B, and 10C are diagrams illustrating examples of the vibration velocity and the vibration acceleration of the LRA 140. FIG. 10A is a diagram illustrating a waveform of the response displacement y3, FIG. 10B is a diagram illustrating a waveform of the velocity y3' that is a differential of the response displacement y3, and FIG. 10C is a diagram illustrating a waveform of the acceleration y3" that is a second-order differential of the response displacement y3.

As illustrated in FIGS. 10A, 10B, and 10C, the waveform of the velocity y3' and the waveform of the acceleration y3" reach 0 at the timing at which the response displacement y3 reaches 0; that is, the vibration of the LRA 40 stops at the timing T.

At this moment, the waveform of the acceleration y3" stops in two periods within 0.01 s. According to the example of FIGS. 10A, 10B, and 10C, the vibration acceleration reaches 0.02 G or less within 0.01 s, and the click feeling by pressing a button 2 may thus be represented.

Note that m=2, and n=1 are specified in the first embodiment; m and n are not limited to these values. In the first embodiment, m and n may be any values insofar as m and n are natural numbers (other than 0), and m≠n. Note that the relationship between m and n may preferably satisfy m>n.

Figure 11A:
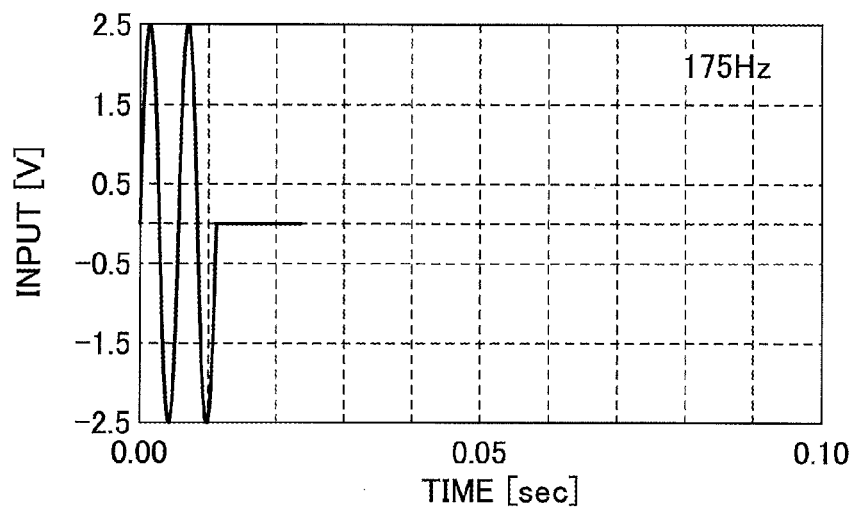
FIG. 11A is a diagram illustrating vibration acceleration of the LRA when the drive signal supplied is a sine wave of a natural frequency of the LRA.

The following illustrates an effect of the first embodiment with reference to FIGS. 11A to 14C. FIGS. 11A, 11B, and 11C are diagrams illustrating the vibration acceleration of the LRA 140 when the drive signal supplied is a sine wave of the resonant frequency of the LRA 140.

Figure 11B:
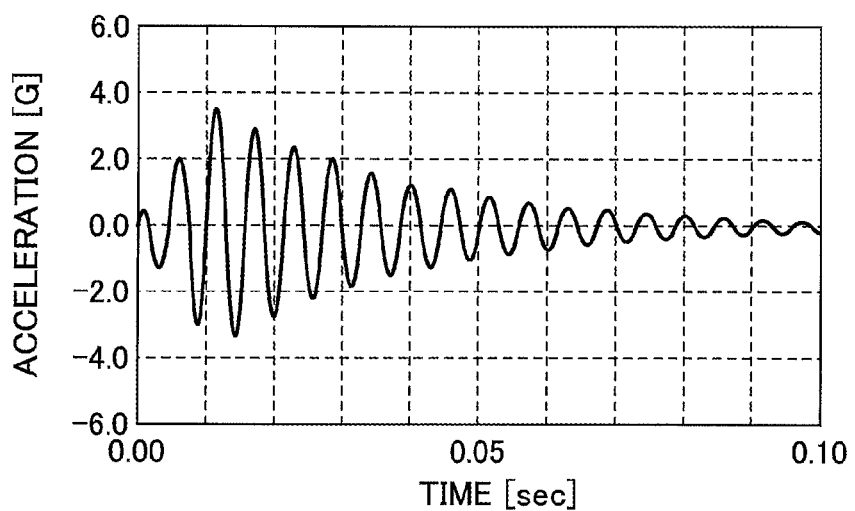
FIG. 11B is a diagram illustrating vibration acceleration of the LRA when the drive signal supplied is a sine wave of a natural frequency of the LRA.
Figure 11C:
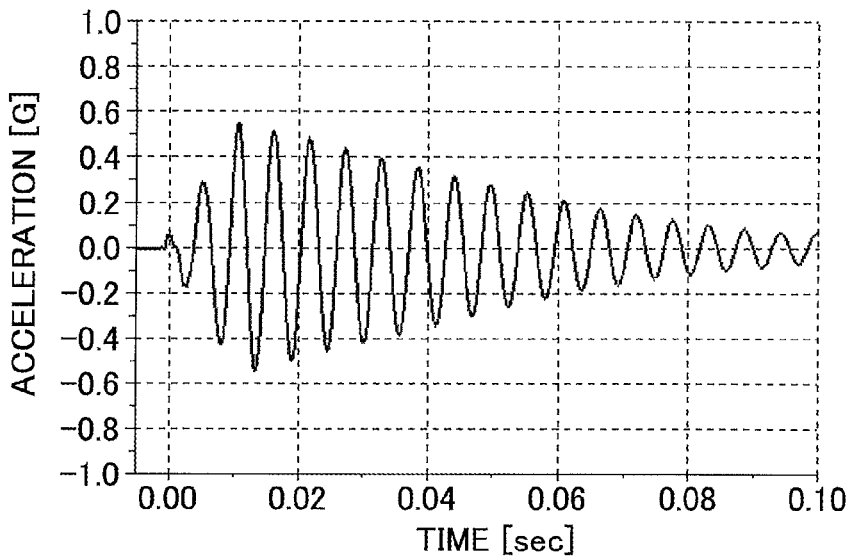
FIG. 11C is a diagram illustrating vibration acceleration of the LRA when the drive signal supplied is a sine wave of a natural frequency of the LRA.

FIG. 11A illustrates the drive signal representing the sine wave having a frequency of 175 Hz identical to the sine wave having the resonant frequency f0=175 Hz of the LRA 140. FIG. 11B illustrates the vibration acceleration of the LRA 140 when the vibration acceleration simulates the sine wave of FIG. 11A as the drive signal. FIG. 11C illustrates vibration acceleration of the touch panel 120 when the drive signal of FIG. 11A is supplied to an actual apparatus implementing the LRA 140 of the resonant frequency f0=175 Hz. Note that the acceleration of the touch panel 120 is detected by an accelerometer disposed in the center of the touch panel 120.

As illustrated in FIGS. 11B and 11C, when the sine wave of the resonant frequency f0 is used as the drive signal, the residual vibration appears for 0.1 s or longer.

Note that in FIG. 11C, the LRA 140 includes the resonant frequency of f0=175 Hz, the weight 41 of 1.5 g, and the spring constant supporting the weight 41 of 1813.5 N/m.

Figure 12A:
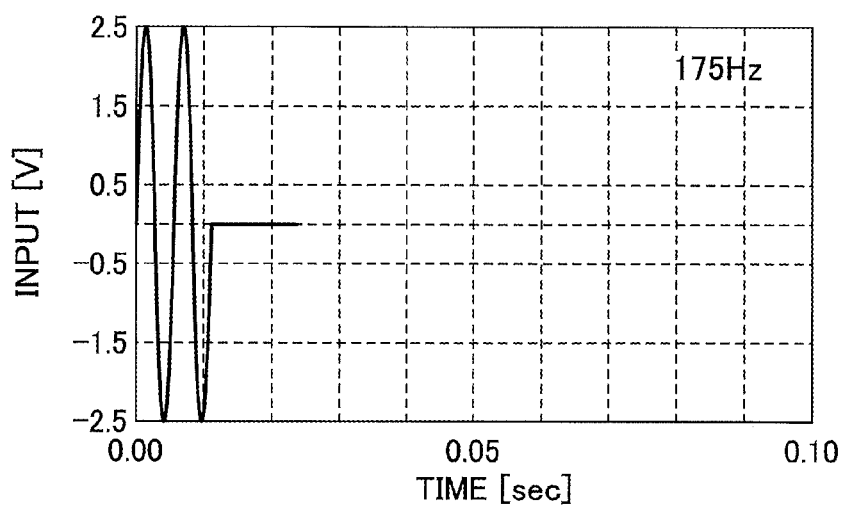
FIG. 12A is a diagram illustrating vibration acceleration of the LRA to which a voltage of an antiphase of the vibration generated by the LRA is applied as a drive control signal after the sine wave of the natural frequency of the LRA as the drive signal being supplied is stopped.
Figure 12B:
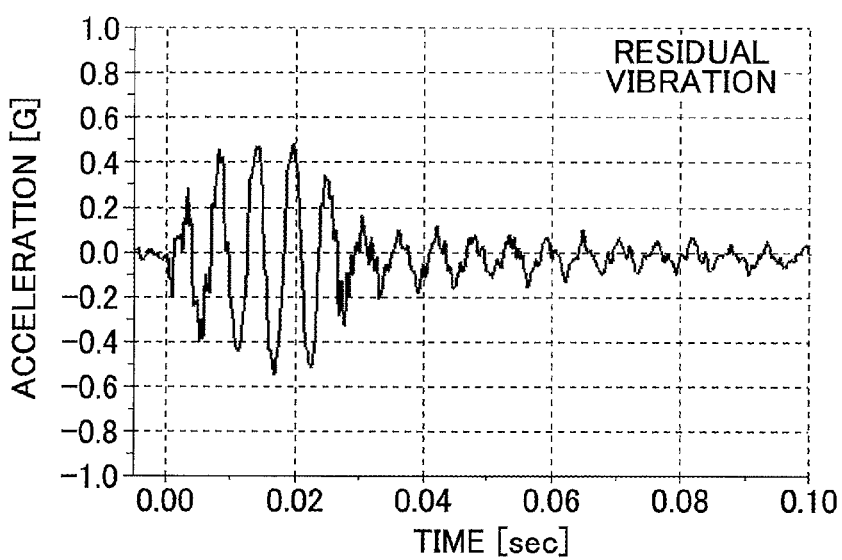
FIG. 12B is a diagram illustrating vibration acceleration of the LRA to which a voltage of an antiphase of the vibration generated by the LRA is applied as a drive control signal after the sine wave of the natural frequency of the LRA as the drive signal being supplied is stopped.

FIGS. 12A and 12B are diagrams illustrating the vibration acceleration of the LRA 140 when a voltage having an antiphase of the vibration generated in the LRA 140 by the drive command is added as a vibration control signal. FIG. 12A illustrates a drive signal of a sine wave having the resonant frequency f0=175 Hz of the LRA 140. FIG. 12B illustrates vibration acceleration of the touch panel 120 when a sine wave of FIG. 12A is applied as the drive signal in the actual apparatus implementing the LRA 140, and the voltage having the antiphase of the vibration generated by the LRA 140 after the drive signal being supplied is stopped.

In the example of FIGS. 12A and 12B, the residual vibration is small compared to the residual vibration in FIGS. 11A, 11B, and 11C. However, 0.05 s or longer is required until the vibration acceleration reaches 0.02 G or less, which is the lower sensory limit of humans.

Figure 13A:
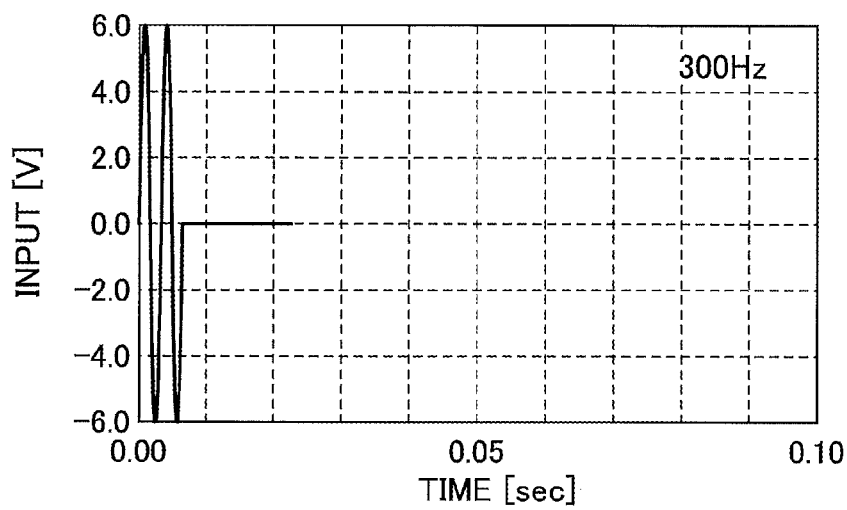
FIG. 13A is a diagram illustrating the vibration acceleration of the LRA when a signal that does not satisfy a specific condition is supplied as a drive signal.
Figure 13B:
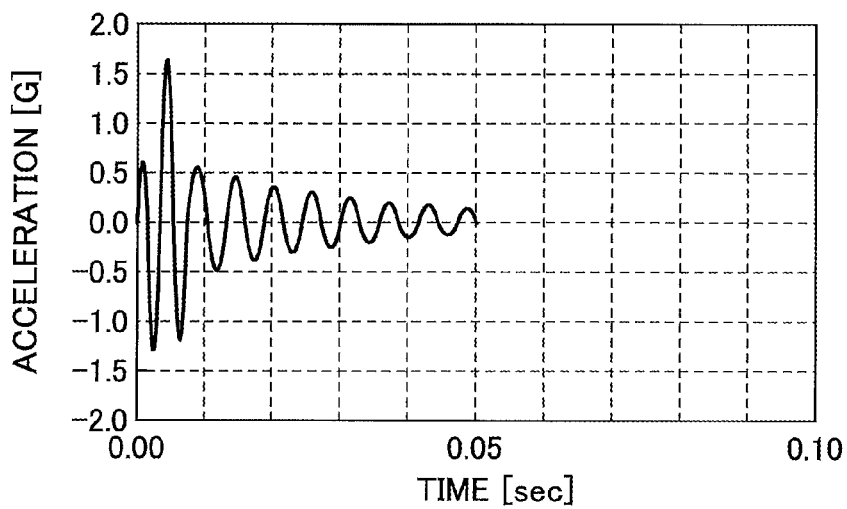
FIG. 13B is a diagram illustrating the vibration acceleration of the LRA when a signal that does not satisfy a specific condition is supplied as a drive signal.
Figure 13C:
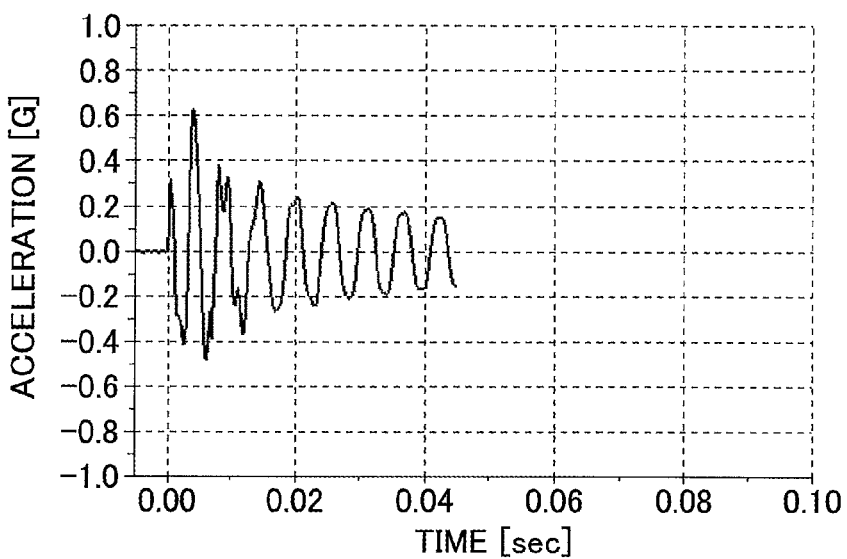
FIG. 13C is a diagram illustrating the vibration acceleration of the LRA when a signal that does not satisfy a specific condition is supplied as a drive signal.

FIGS. 13A, 13B, and 13C are diagrams illustrating the vibration acceleration of the LRA 140 when a signal that does not satisfy the specific condition is supplied as the drive signal.

FIG. 13A illustrates a drive signal of a sine wave having the resonant frequency of 300 Hz that does not satisfy the specific condition. FIG. 13B illustrates vibration acceleration of the LRA 140 when the vibration acceleration simulates the sine wave of FIG. 13A as the drive signal. FIG. 13C illustrates vibration acceleration of the touch panel 120 when the drive signal of FIG. 13A is supplied to an actual apparatus implementing the LRA 140 of the resonant frequency f0=175 Hz.

As illustrated in FIGS. 13B and 13C, when the sine wave of the resonant frequency that does not satisfy the specific condition is supplied as the drive signal, the residual vibration appears for 0.04 s or longer.

Figure 14A:
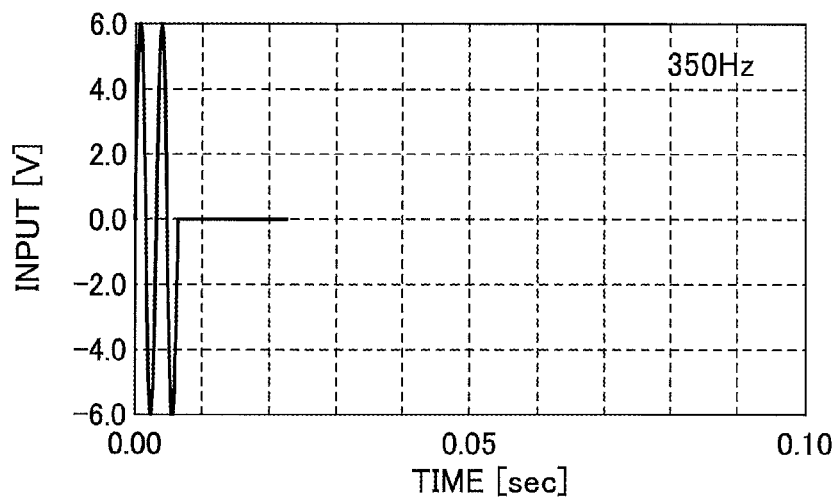
FIG. 14A is a diagram illustrating the vibration acceleration of the LRA when a signal that satisfies a specific condition is supplied as a drive signal.
Figure 14B:
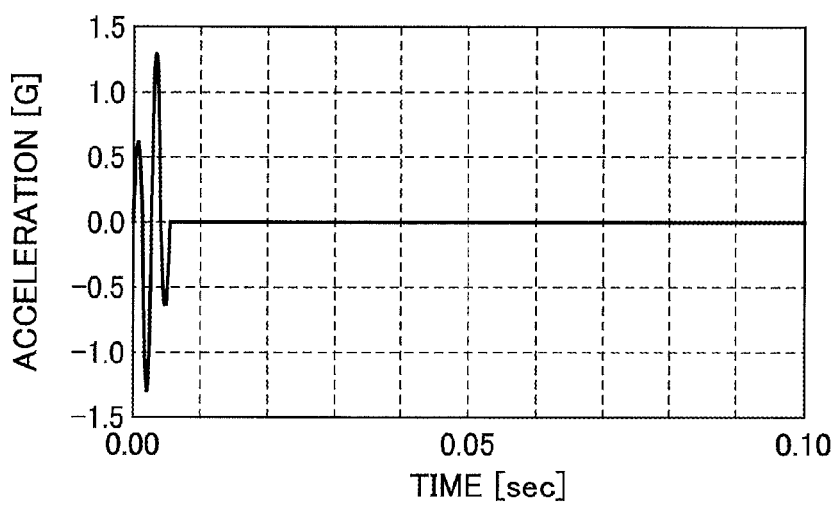
FIG. 14B is a diagram illustrating the vibration acceleration of the LRA when a signal that satisfies a specific condition is supplied as a drive signal.
Figure 14C:
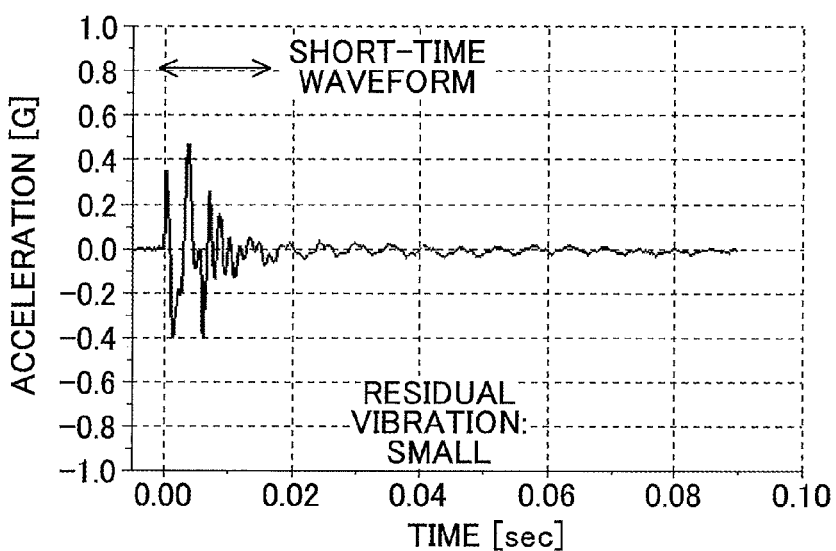
FIG. 14C is a diagram illustrating the vibration acceleration of the LRA when a signal that satisfies a specific condition is supplied as a drive signal.

FIGS. 14A, 14B, and 14C are diagrams illustrating vibration acceleration of the LRA 140 when a signal that satisfies the specific condition is supplied as the drive signal.

FIG. 14A illustrates a drive signal of a sine wave having the resonant frequency of 350 Hz that satisfies the specific condition. FIG. 14B illustrates vibration acceleration of the LRA 140 when the vibration acceleration simulates the sine wave of FIG. 14A as the drive signal. FIG. 14C illustrates vibration acceleration of the touch panel 120 when the drive signal of FIG. 14A is supplied to an actual apparatus implementing the LRA 140 of the resonant frequency f0=175 Hz.

As illustrated in FIGS. 14B and 14C, the acceleration of the residual vibration after 0.02 s reaches 0.02 G or less, which is the lower sensitivity limit of humans, and the vibration waveform is a short-time waveform.

Thus, when the drive signal is a signal of a frequency f1 expressed by "f1=(m/n)×f0 (m and n are natural numbers other than 0, and m≠n)" that vibrates the LRA 140 m times, where f0 represents the resonance frequency of the LRA 140, the waveform of the vibration generated by the LRA 140 may eliminate the residual vibration. Further, the waveform of the vibration acceleration of the touch panel 120 in the actual apparatus implementing the LRA 140 is a short-time waveform representing a rapid damping in one to several periods to provide the click feeling.

Figure 15:
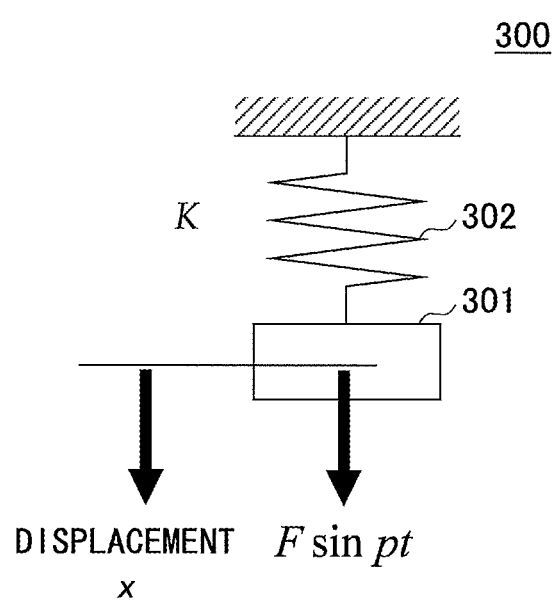
FIG. 15 is a diagram illustrating a vibration system 300 having an object 301 and a spring 302.

Next, an illustration is given of displacement x of an object having a mass M illustrated in FIG. 15. FIG. 15 is a diagram illustrating a vibration system 300 having an object 301 and a spring 302.

In FIG. 15, M represents a mass of the object 301, and the object 301 is connected to a lower end of the spring 302. Further, K represents a spring constant of the spring 302. An upper end of the spring 302 is a fixed end, and the lower end of the spring 302 is a free end.

Note that in FIG. 15, an origin is determined as a position (a balance position) of the object 301 suspended from the spring 302 without applying force to the object 301, and displacement of the object 301 with respect to the origin is expressed by x. A positive direction of the displacement x indicates a vertical and downward direction.

In addition, when ω represents a natural angular frequency of the free vibration of the object 301 in the vibration system 300, the natural angular frequency ω is expressed by the following formula (3), and the frequency f0 of the free vibration is f0=ω/2π.

$$\omega = \sqrt{\frac{K}{M}} \quad (3)$$

In the vibration system 300, sine wave force (forced force) F sin pt is applied to the object 301. In this case, p represents an angular frequency of the forced force, and t represents time. The frequency f1 of the forced vibration obtained by the harmonic force is f1=p/2π. The frequency f1 satisfies a condition expressed by f1=(m/n)×f0, where m and n are natural numbers other than 0, and are mutually different (m≠n).

The displacement x of the object 301 obtained by the application of the forced vibration to the object 301 is expressed by the following formula (4).

$$x = \frac{F}{m}\left(-\frac{p}{\omega(\omega^2 - p^2)}\sin\omega t + \frac{1}{(\omega^2 - p^2)}\sin pt\right) \quad (4)$$

Now, the important point to note is ω≠p. If ω≠p and damping is zero, x can't be formulated in linear theory. In the right side of the formula (4), the left side term in brackets indicates a free vibration component and the right side term in brackets indicates a forced vibration component. Note that in this formula, it is assumed that the displacement x and the velocity x' at the time t=0 become 0.

As is obvious from the formula (4), the displacement x of the object 301 is expressed as a synthesis of the free vibration component and the forced vibration component. This indicates similar to the illustration already given above with reference to FIGS. 9A and 9B. That is, when the forced vibration component y1 and the free vibration component y2 of the vibration displacement generated by supplying the drive signal F to the LRA 140 are applied, the response displacement y3 obtained by supplying the drive signal F to the LRA 140 will be a sum of the forced vibration component y1 and the free vibration component y2.

Note that similar to the illustration in FIGS. 14A to 14C, FIG. 16 illustrates the free vibration, the forced vibration, and the response vibration expressed by the formula (4) when the harmonic force F sin pt is applied to the object 301 as the sine wave drive signal satisfying the specific condition. The response vibration is applied as synthesized vibration of the free vibration and the forced vibration.

Figure 16:
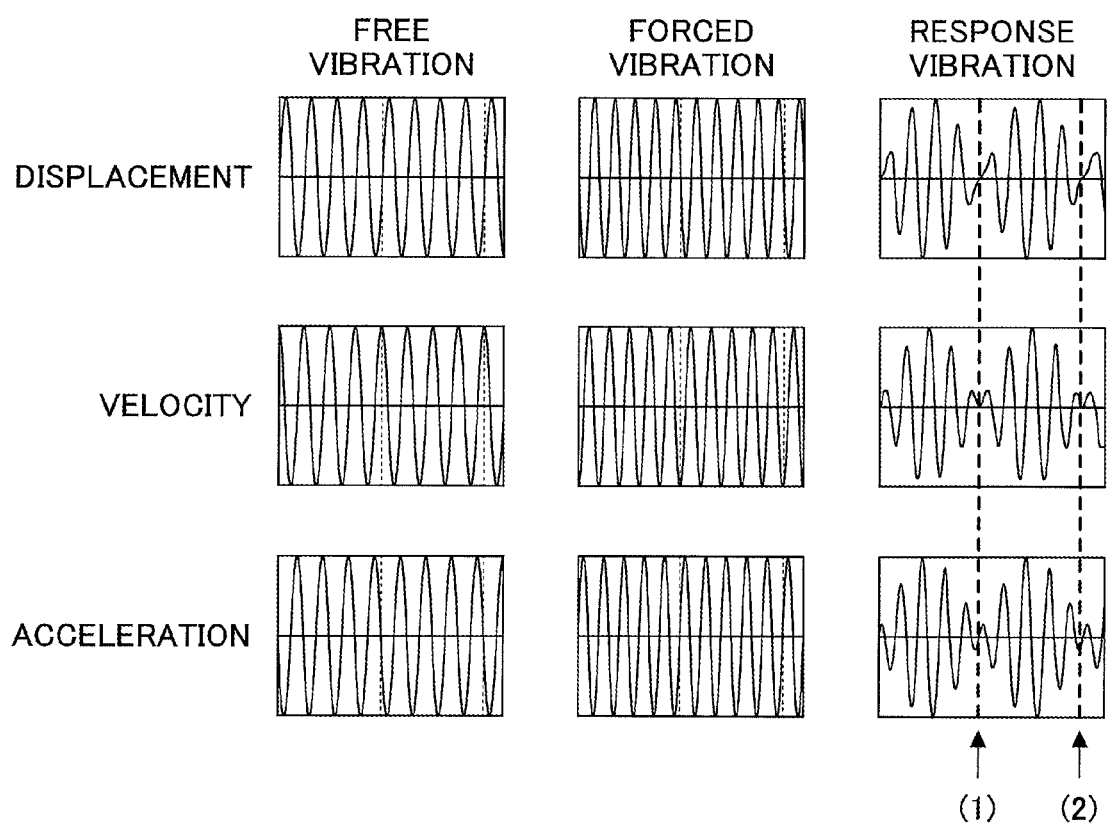
FIG. 16 includes diagrams illustrating displacement, velocity, and acceleration of each of free vibration, forced vibration, and response vibration when forced vibration F sin pt is applied to the object 301.

FIG. 16 is a diagram illustrating the displacement, the velocity, and the acceleration of each of the free vibration, the forced vibration, and the response vibration when the harmonic force F sin pt is applied to the object 301. The velocity x' is expressed by a primary differential of the displacement x and the acceleration x" is expressed by a secondary differential of the displacement x.

Note that FIG. 16 illustrates the waveforms obtained by vibrating the object 301 by the application of the harmonic force, where the frequency f1 of the forced vibration is f1=5/4×f0 (m=5, n=4).

As can be seen from the displacement, the velocity, and the acceleration of the response vibration in FIG. 16, the velocity and the acceleration of the response vibration become 0 at the timing (1) and (2) where the displacement x becomes 0. The timing (1) is where the harmonic force is applied 4 times, and the timing (2) is where the harmonic force is applied 8 times.

Note that in the following, whether there are other timings at which the displacement, the velocity, and the acceleration of the response vibration are all 0 is determined.

The displacement x, the velocity x' that is a primary time differential of the displacement x, and the acceleration x" that is a secondary time differential of the displacement x are expressed by the following formulas (5).

$$\left.\begin{aligned} x &= \frac{F}{m}\frac{1}{\omega(\omega^2 - p^2)}(-p\sin\omega t + \omega\sin pt) \\ x' &= \frac{F}{m}\frac{p}{\omega^2 - p^2}(\cos pt - \cos\omega t) \\ x'' &= \frac{F}{m}\frac{p}{\omega^2 - p^2}(\omega\sin\omega t - p\sin pt) \end{aligned}\right\} \quad (5)$$

If there is a timing at which the displacement x, the velocity x' and the acceleration x" are 0 simultaneously, the mass M stops immediately without residual vibration when the driving force is stopped at that timing. The question is whether equations (5) have such special timings exactly. The solution is shown below. The timing at which the displacement x and the acceleration x″ in the formulas (5) are both 0 is obtained by the following formulas (6).

$$\begin{cases} -p\sin\omega t + \omega\sin pt = 0 \\ \omega\sin\omega t - p\sin pt = 0 \end{cases} \quad (6)$$

Because of $\omega \neq p(\neq 0)$, solving the formulas (6) as simultaneous equations for $\sin \omega t$ and $\sin pt$, the following formulas (7) are obtained.

$$\sin \omega t = 0$$

$$\sin pt = 0 \quad (7)$$

Since $\omega, p > 0$ and the "special timing" t must be larger than 0, if exists, the following formulas (8) are obtained.

$$\begin{cases} \omega t = \alpha\pi \quad \alpha = 1, 2, \ldots \\ pt = \beta\pi \quad \beta = 1, 2, \ldots \end{cases} \quad (8)$$

Now, writing $\alpha = m \times b$, $\beta = n \times b$, the following formulas (9) are obtained.

$$\begin{cases} \omega t = nb\pi \quad n, b = 1, 2, \ldots \\ pt = mb\pi \quad m, b = 1, 2, \ldots \end{cases} \quad (9)$$

The formulas (9) imply $$p = \frac{m}{n}\omega \quad (10)$$

$$t = \frac{n\pi}{\omega}b = \frac{m\pi}{p}b \quad (11)$$

Because of $\omega \neq p$, $n \neq m$ is self-evidence in the formulas (10). Now, writing $$p = 2\pi f_1, \omega = 2\pi f_0 \quad (12)$$

and substituting formula (12) to the formula (10), the following formula (13) is obtained.

$$f_1 = \frac{m}{n}f_0 \quad (13)$$

Substituting the formula (13) to the formula (11), the following formula (14) is obtained.

$$t = \frac{1}{f_1}\frac{m}{2}b \quad (14)$$

That is, when b is a natural number other than 0 (Q=1, 2, . . . ) in $t = (n\pi/\omega) \times b = (m\pi/p) \times b$, the displacement x and the acceleration x″ are both 0.

Hence, when $f_1 = (m/n) \times f_0$ expressed by the formula (13) and $t = (1/f_1) \times (m/2) \times b$ expressed by the formula (14) are both satisfied, the displacement x and the acceleration x″ are both 0. That is, the displacement x and the acceleration x″ are both 0 when the harmonic force is applied $(m/2) \times b$ times of vibration periods, because 1/f1 means time length of 1 period vibration of frequency f1. Namely, both x and x′ becomes 0 every time that harmonic force is applied m/2 periods.

In addition to the displacement x and the acceleration x″, setting x′=0 in the formulas (5), the following formula (15) is obtained.

$$\cos pt - \cos \omega t = 0 \quad (15)$$

This equation may holds for the two cases as noted below in the formulas (16).

$$(A) \cos pt = \cos t\omega \neq 0$$

$$(B) \cos pt = \cos t\omega = 0 \quad (16)$$

Initially, the first case (A) is considered. Substituting the formula (11) to the first case, the following formula (17) is obtained.

$$\cos\frac{p}{\omega}nb\pi = \cos nb\pi \quad (17)$$

Where, the right side of the formula (17) must be +1 or −1, because n and b are natural numbers other than 0.

Now, by the formula (10), the following formula (18) is obtained.

$$\frac{p}{\omega}nb = mb \quad (18)$$

Substituting the formula (18) to the formula (17), the following formula (19) is obtained.

$$\cos mb\pi = \cos nb\pi \quad (19)$$

The formula (19) holds for the case that m×b and n×b have the same parity. This can be divided two conditions below.

In the case (A-1), parity of m and n is arbitrary. Therefore, writing b=2c (c=1, 2, 3, . . . ) and substituting to the formula (14), the following formula (20) is obtained.

$$t = \frac{m}{2f_1}b = \frac{m}{2f_1}2c = \frac{1}{f_1}mc \quad (20)$$

Hence, when the object 301 is vibrated at $f_1 = (m/n) \times f_0$, and "$t = (1/f_1) \times m \times c$" expressed by the formula (20) is established, the velocity x′ becomes 0 in addition to the displacement x and the acceleration x″.

This condition is similar to the condition illustrated in FIGS. 14A to 14C. And furthermore, in the case (A-2), writing b=2c-1 (c=1, 2, 3 . . . ) and substituting to the formula (14), the following formula (21) is obtained.

$$t = \frac{1}{f_1}\frac{m}{2} \times b = \frac{1}{f_1}\frac{m}{2} \times (2c-1) \quad (21)$$

Herein, if m is even number (m=2d, d=1, 2, 3, . . . ), the following formula (22) is obtained.

$$t = \frac{1}{f_1} d \times (2c - 1) \qquad (22)$$

The formula (22) is obviously included in (20). Therefore, the case that m are odd in the formula (21) is meaningful.

The second case (B) holds for $\alpha = (2k-1)h \quad k, h = 1, 2, \ldots$ $\beta = (2l-1)h \quad l, h = 1, 2, \ldots \qquad (23)$ Now, writing $$pt = \frac{\pi}{2}\alpha \quad \alpha = 1, 2, \ldots \qquad (24)$$
$$\omega t = \frac{\pi}{2}\beta \quad \beta = 1, 2, \ldots$$

and substituting the formulas (24) to the formula (16), the following formulas (25) are obtained.

$$pt = \frac{\pi}{2}(2k-1)h \quad k, h = 1, 2, \ldots \qquad (25)$$
$$\omega t = \frac{\pi}{2}(2l-1)h \quad l, h = 1, 2, \ldots$$

Where, $k \neq l$ is self-evident because of $\omega \neq p$. Substituting the formula (25) to the formula (14), the following formula (26) is obtained.

$$t = \frac{\pi}{2p}(2k-1) \times h = \frac{\pi}{2\omega}(2l-1) \times h \qquad (26)$$

Moreover, the formula (26) implies $$p = \frac{2k-1}{2l-1}\omega \qquad (27)$$

Writing $p = 2\pi f_1, \omega = 2\pi f_0 \qquad (28)$ and substituting to the formula (27), (26), the following formulas (29) and (30) are obtained.

$$f_1 = \frac{2k-1}{2l-1} f_0 \qquad (29)$$

$$t = \frac{2\pi}{p} \frac{2k-1}{4} h = \frac{1}{f_1} \frac{2k-1}{4} h \qquad (30)$$

If the formula (14) and (30) holds for the same timing t, $(2k-1)h = 2mb \qquad (31)$ must be satisfied. Since the right side of the formula (31) must be even number, h must be even number. Now, writing $h = 2Q$ ($Q = 1, 2, 3, \ldots$), the formula (30) is $$t = \frac{1}{f_1} \frac{2k-1}{2} Q \qquad (32)$$

Hence, the formula (32) includes the condition that m is odd number in the formula (21).

Accordingly, the velocity x' expressed by the formula (5) becomes 0 in addition to the displacement x being 0 and the acceleration x" being 0 when the object 301 is vibrated m times at the frequency f1 where Q is an natural number other than 0 and when the object 301 is vibrated "(m/2)×Q" times at the frequency f1 where n and m are both odd numbers. Among the above conditions, the former is the same condition as that illustrated in FIGS. 14A to 14C, and the latter condition is newly obtained. The latter condition indicates that the object 301 is vibrated "(m/2)×Q" times at the frequency f1, where n and m are both odd numbers. The following illustrates the latter condition with reference to FIG. 17.

Figure 17:
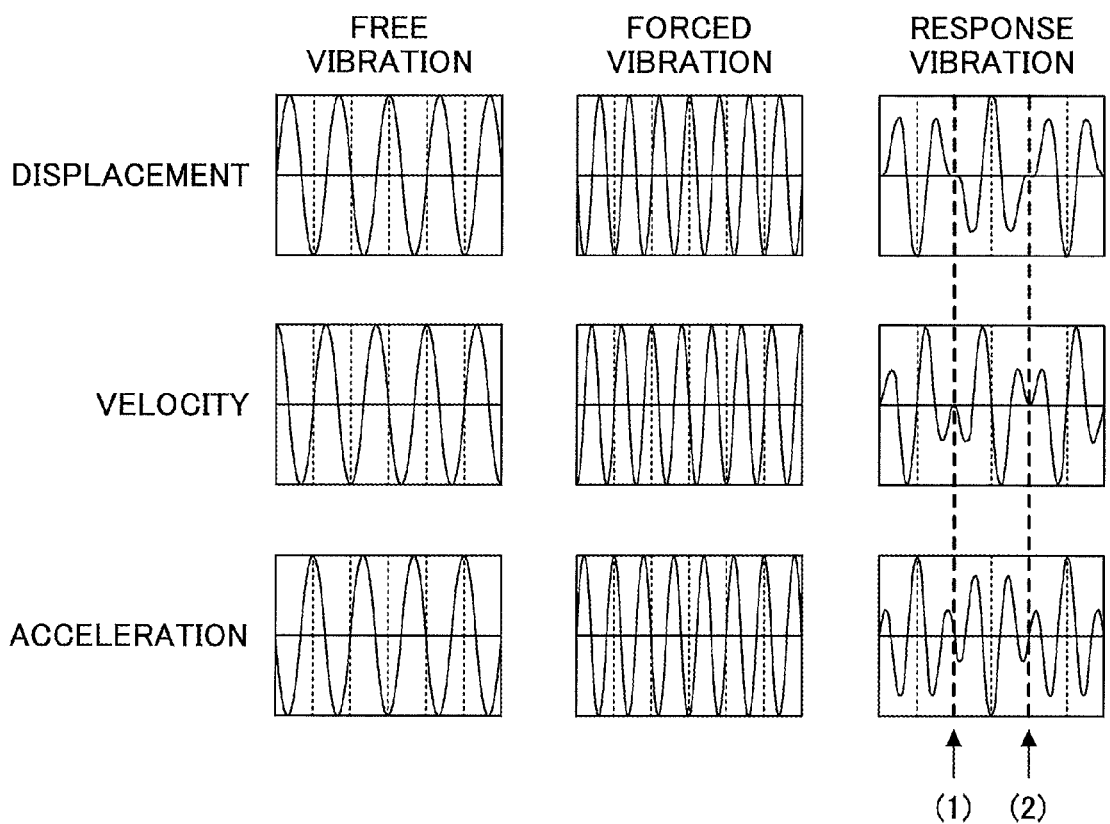
FIG. 17 includes diagrams illustrating displacement, velocity, and acceleration of each of the free vibration, the forced vibration, and the response vibration when the object 301 is vibrated "(m/2)×Q" times at the frequency f1, where n and m are both odd numbers.

FIG. 17 includes diagrams illustrating the displacement, the velocity, and the acceleration of each of the free vibration, the forced vibration, and the response vibration when the object 301 is vibrated "(m/2)×Q" times at the frequency f1, where n and m are both odd numbers. Note that FIG. 17 illustrates the waveforms obtained by vibrating the object 301 by the application of the forced vibration, where the frequency f1 of the forced vibration is f1=5/3×f0 (m=5, n=3). The timing (1) is where the harmonic force is applied 5/2 times, and the timing (2) is where the harmonic force is applied 5 times.

As illustrated in FIG. 17, the displacement, the velocity, and the acceleration of the response vibration are all 0 at the timing (1) at which the object 301 is vibrated 5/2 times. Similarly, the displacement, the velocity, and the acceleration of the response vibration are all 0 at the timing (2) at which the object 301 is vibrated 5 times. The timing (2) corresponds to a case where m and n are odd numbers in the operation condition illustrated in FIGS. 14A to 14C.

As described above, according to the first embodiment, the displacement, the velocity, and the acceleration of the response vibration may all be 0 when the object 301 is vibrated "(m/2)×Q" times at the frequency f1(=(m/n)×f0) where n and m are both odd numbers. Note that Q is a natural number other than 0, and Q=1, 2, . . . .

Accordingly, in a case where waveform data to vibrate the object 301 "(m/2)×Q" times at the frequency f1(=(m/n)×f0), where n and m are both odd numbers, are stored in the memory as the waveform data 240 representing the drive signal to drive the LRA 140, the click feeling may be provided by the vibration generated by the LRA 140 at a time where a user operates the touch panel 120.

The click feeling presented at the timing (1) illustrated in FIG. 17 is implemented within half the vibration period of the click feeling presented at the timing (2). Hence, a more distinct click feeling may be provided.

Figure 18:
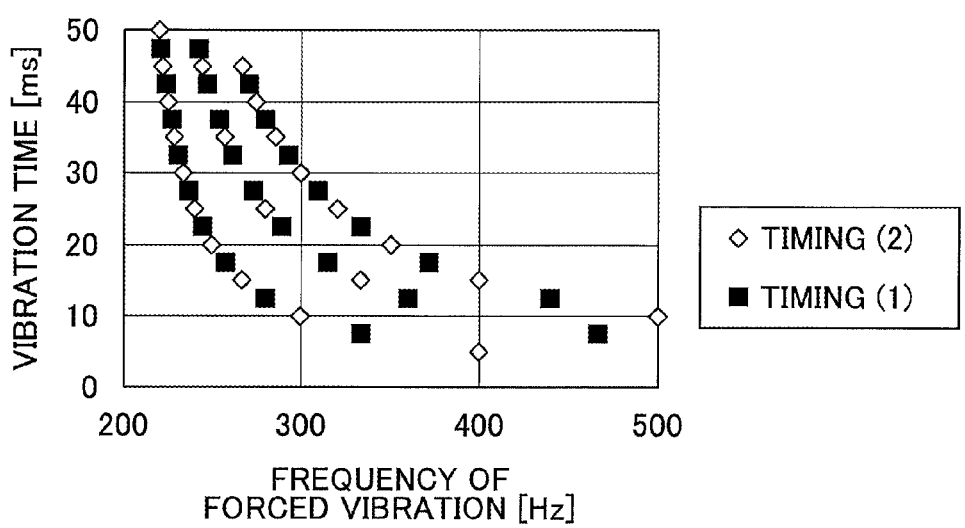
FIG. 18 is a diagram illustrating a relationship between the frequency of the forced vibration and vibration time.

FIG. 18 is a diagram illustrating a relationship between the frequency of the forced vibration and the vibration time. FIG. 18 illustrates operation points at the timing (1) and operation points at the timing (2) of FIG. 17.

As described above, the click feeling presented at the timing (1) is implemented by half the vibration period of the click feeling presented at the timing (2). Accordingly, to set the frequency of the forced vibration between 200 Hz and 500 Hz, the operation points at the timing (1) may interpolate intervals between the operation points at the timing (2). Specifically, since the operation points at the timing (2) may be discrete on the high frequency side, the interpolation by the operation points at the timing (1) may be advantageous.

When the frequency of the forced vibration is set in the actual electronic apparatus 100, actually selectable operation points may be restricted due to the consideration of the natural frequency of the touch panel 120, or limitation such as the operation points being on the high frequency side.

However, a range of the selectable operation points for setting the frequency of the forced vibration may be increased since the operation points at the timing (1) are obtained to interpolate intervals between the operation points at the timing (2).

When the damping of the free vibration of the LRA 140 is relatively large, any one of the displacement, the velocity, and the acceleration of the response vibration by the supply of the above-described drive signal may fail to be 0 at the timings (1) and (2).

Accordingly, the following method enables all the displacement, the velocity, and the acceleration of the response vibration to be 0 in consideration of the damping of the free vibration of the LRA 140.

Figure 19:
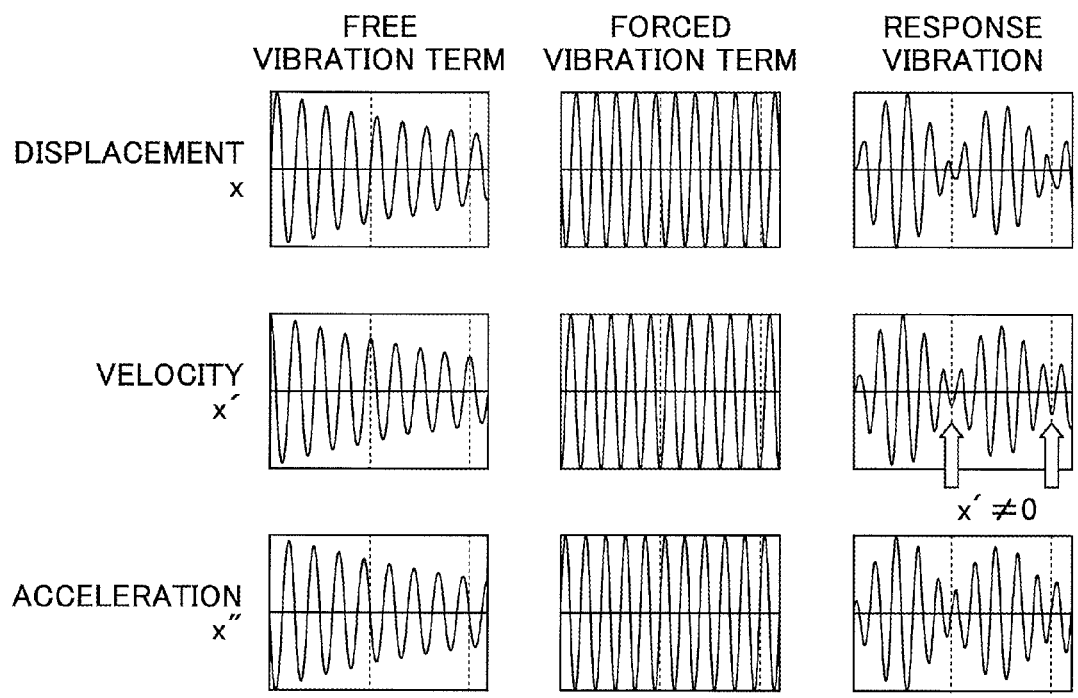
FIG. 19 includes diagrams illustrating displacement, velocity, and acceleration of each of the free vibration, the forced vibration, and the response vibration when the object 301 is vibrated "(m/2)×Q" times at the frequency f1, where n and m are both odd numbers.

FIG. 19 is a diagram illustrating the displacement, the velocity, and the acceleration of each of the free vibration, the forced vibration, and the response vibration when relatively large damping is present in the free vibration.

The displacement x of the free vibration of the LRA 140 illustrated in FIG. 19 dampens with time compared to the free vibration (no damping) illustrated in FIG. 16. Accordingly, the velocity x', and the acceleration x" also dampen with time.

When the relatively large damping is present in the free vibration as described above, the velocity of the response vibration will not be 0 at the timings (1) and (2), for example. This is because damping is present in the free vibration of the LRA 140 but the waveform of the forced vibration is similar to the waveform of the forced vibration illustrated in FIG. 16, which indicates that a waveform of the response vibration obtained by synthesizing the free vibration and the forced vibration differs from the corresponding waveform illustrated in FIG. 16.

In the first embodiment, the damping ratio of the free vibration is obtained based on the acceleration of the free vibration because an damping ratio is common to the displacement, the velocity, and the acceleration. Note that the damping ratio of the free vibration is computed based on the acceleration of the free vibration because the acceleration may be relatively easily measured by an accelerometer among the displacement, the velocity, and the acceleration of the free vibration. Further, properties of humans' sensory organ appear to match the accelerometer. For example, a measuring system 400 illustrated in FIG. 20 measures the acceleration of the free vibration.

Figure 20:
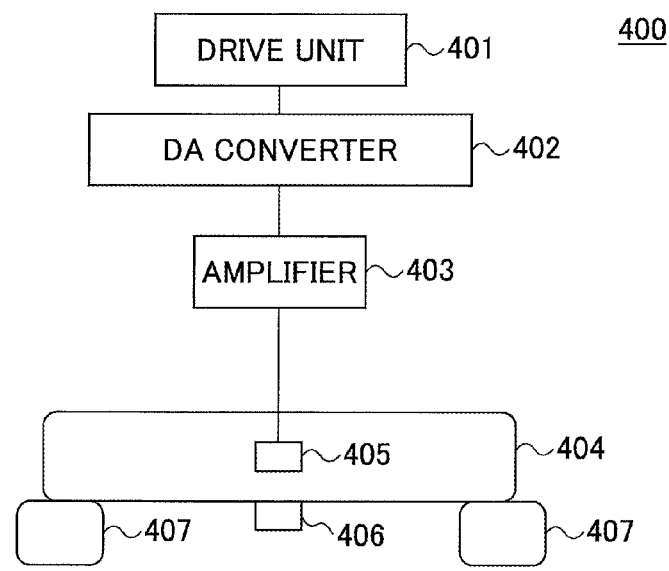
FIG. 20 is a flowchart illustrating a measuring system 400 configured to measure the acceleration of the free vibration.

FIG. 20 is a flowchart illustrating the measuring system 400 configured to measure the acceleration of the free vibration. The measuring system 400 includes a drive unit 401, a DA (digital-to-analog) converter 402, an amplifier 403, a weight 404, a vibrator 405, an accelerometer 406, and a sponge 407.

The drive unit 401 includes predetermined waveform data, and is configured to output a drive signal expressed by the waveform data to the DA converter 402. Note that the predetermined waveform data may preferably be waveform data 240 implementing the forced vibration.

The weight 404 may have a weight equal to a weight of the touch panel 120 when the LRA 140 is attached to the touch panel 120 as illustrated in FIG. 3 in the actual electronic apparatus 100. Note that a member to which the LRA 140 is actually attached may be used instead of the weight 404. As illustrated in FIG. 3, when the LRA 140 is attached to the touch panel 120, the touch panel 120 may serve as a weight instead of the weight 404.

The vibrator 405 is disposed near the center of the weight 404, and the accelerometer 406 is attached to the weight 404. An end of the weight 404 may be rested on an installation stand or the like via the sponge 407.

In the above-described measuring system 400, the drive signal is output from the drive unit 401 to the DA converter 402, the drive signal converted by the DA converter into an analog signal is amplified by the amplifier 403, and the amplified analog signal is supplied to the vibrator 405. The vibrator 405 may, for example, be an LRA.

The vibrator 405 is driven by the drive signal supplied from the amplifier 403 to vibrate the weight 404. The damping properties of the free vibration of the LRA 140 may be obtained by measuring the free vibration using the accelerometer 406 after the drive signal is switched off.

FIGS. 21A and 21B are diagrams illustrating damping of the acceleration of the free vibration. For example, when driving of the vibrator 405 starts at t=0 s, and the drive signal stops at t=0.04 s, a waveform of the free vibration alone is obtained from t=0.04 s onward as illustrated in FIG. 21A. Data of an envelope 410, which represents the damping properties of the free vibration as illustrated by a thick line 410 in FIG. 21A, may be obtained by measuring the damping of the free vibration using the accelerometer 406. Note that the envelope 410 may be obtained by using the Hilbert transform or the like.

The envelope 410 illustrated in FIG. 21A may be expressed by $z=e^{-\sigma t}$. In this case, $-\sigma$ is a coefficient representing the damping ratio.

Properties illustrated in FIG. 21B are obtained by representing the envelope 410 illustrated in FIG. 21A with a semi-logarithmic graph. The inclination of the envelope illustrated in FIG. 21B is $-\sigma$.

In the first embodiment, operation points having the displacement x, the velocity x', and the acceleration x" of the response vibration being all 0 may be obtained by multiplying the displacement x, the velocity x', and the acceleration x" of the response vibration by thus obtained damping properties.

Specifically, the waveform data 240 representing the drive signal F=A sin 2π f1t being multiplied by the damping properties $z=e^{-\sigma t}$ are stored in the memory 220, and the LRA 140 is driven by the drive signal being multiplied by the damping properties.

The drive signal F1 being multiplied by the damping properties is expressed by the following formula:

$$F1 = A(e^{-\sigma t})\sin 2\pi f1 t$$

Figure 22:
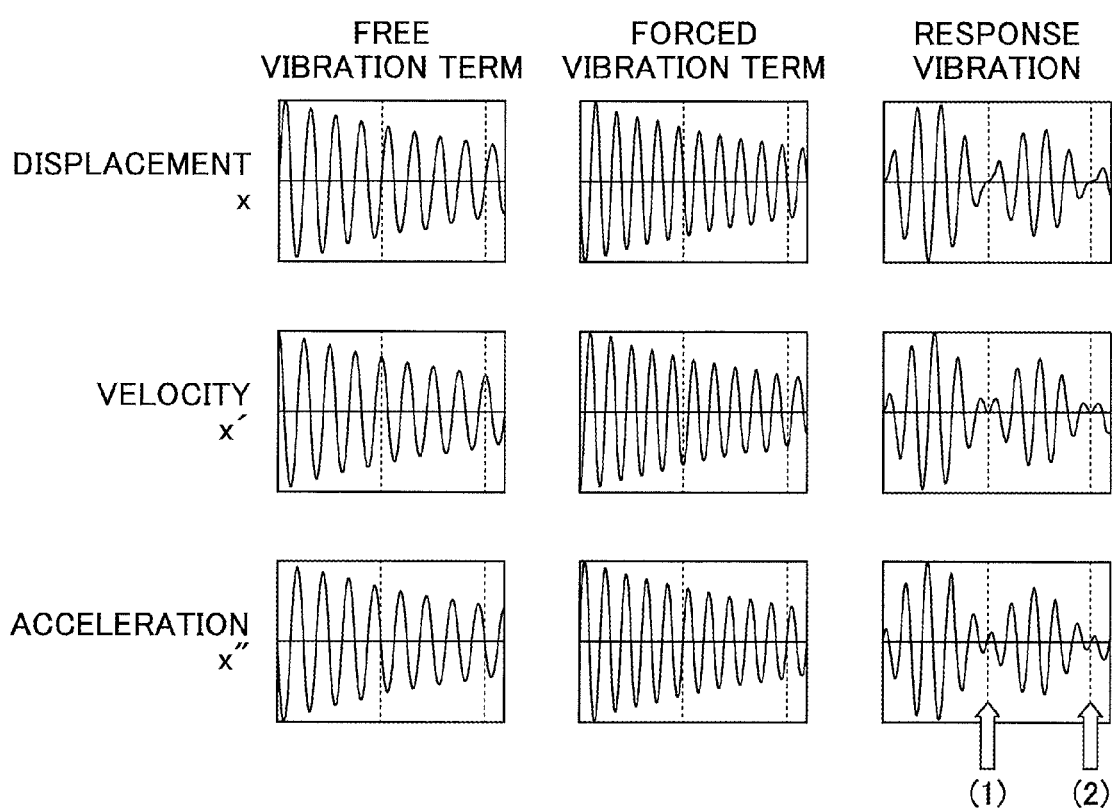
FIG. 22 includes diagrams illustrating displacement, velocity, and acceleration of each of the free vibration, the forced vibration, and the response vibration when the LRA 140 is driven by a drive signal F1.

The displacement, the velocity, and the acceleration of the response vibration when the LRA 140 is driven by supplying the drive signal F1 are illustrated in FIG. 22.

FIG. 22 includes diagrams illustrating the displacement, the velocity, and the acceleration of each of the free vibration, the forced vibration, and the response vibration when the LRA 140 is driven by the drive signal F1.

As illustrated in FIG. 22, the displacement x, the velocity x', and the acceleration x" of the response vibration are all 0 at the timings (1) and (2).

Figure 23A:
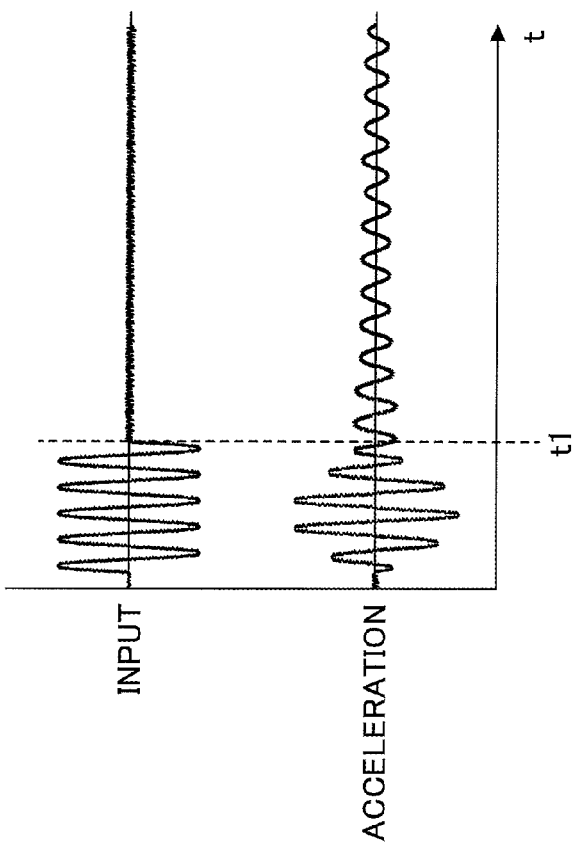
FIG. 23A is a diagrams illustrating a difference in a residual vibration between the presence or absence of damping properties.
Figure 23B:
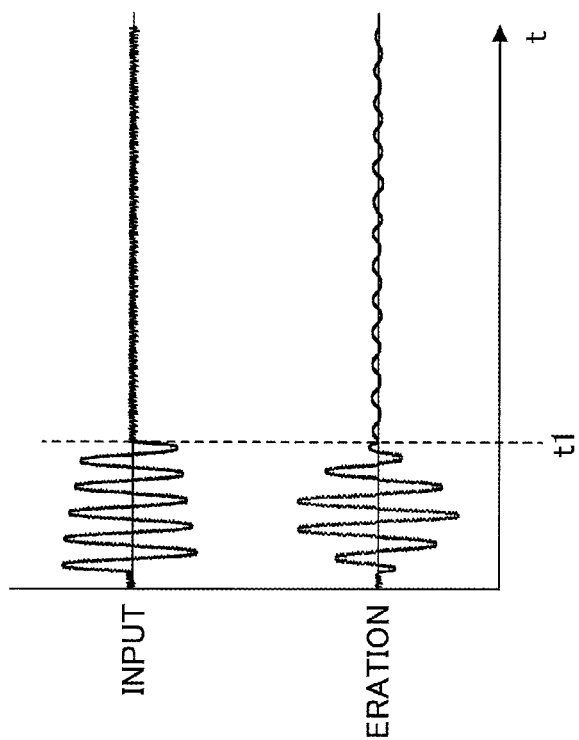
FIG. 23B is a diagrams illustrating a difference in a residual vibration between the presence or absence of damping properties.

FIGS. 23A and 23B are diagrams illustrating a difference in a residual vibration between the presence or absence of the damping properties. FIGS. 23A and 23B illustrate the acceleration of the vibration driven by the drive signal where m=5, and n=4.

FIG. 23A illustrates the acceleration of the free vibration generated after the drive signal F is switched off at time t1, where the drive signal F (=A sin 2π f1t) that is not multiplied by the damping properties serves as an input signal.

FIG. 23B illustrates the acceleration of the free vibration generated after the drive signal F1 is switched off at time t1, where the drive signal F1 (=A (e$^{-\sigma t}$)sin 2π f1t) that is multiplied by the damping properties serves as an input signal.

As is clear from a comparison between FIGS. 23A and 23B, relatively large residual vibration remains from time t1 onward in FIG. 23A, whereas little vibration remains in FIG. 23B. The acceleration from time t onward in FIG. 23B reaches 0.02 G or lower, at which humans fail to detect the vibration.

As described above, in the first embodiment, even if the damping of the free vibration is relatively large, it may be possible to reliably obtain the timing at which the displacement x, the velocity x', and the acceleration x" of the response vibration are all 0 by including the damping ratio representing the damping properties of the free vibration into the drive signal.

Accordingly, the click feeling generated by the vibration of the LRA 140 may be presented by including the damping ratio representing the damping properties of the free vibration to the drive signal as the waveform data 240 representing the drive signal driving the LRA 140.

The drive signal before including the damping ratio representing the damping properties of the free vibration may be any of the following two cases.

The first case involves a drive signal that is a signal of a frequency f1 expressed by the following formula "f1=(m/n)×f0 (m and n are natural numbers other than 0, and m≠n)" that vibrates the LRA 140 m×Q times at the frequency f1, where f0 represents a resonance frequency of the LRA 140 and Q is natural numbers other than 0. In this case, the vibration obtained is illustrated in FIGS. 14A to 14C.

The second case involves a drive signal representing the waveform data that vibrates "(m/2)×Q" times at the frequency f1 (=(m/n)×f0), where n and m are both odd numbers, may be applied as the waveform data 240 representing the drive signal driving the LRA 140. In this case, the vibration obtained is illustrated in FIG. 17.

Note that the first embodiment in which the drive signal applied being a sine wave is described above; however, the drive signal is not limited to the sine wave, and may be a waveform other than the sine wave such as a rectangular wave.

In addition, the electronic apparatus 100 of the first embodiment includes a configuration in which the LRA 140 is attached to a surface on a housing-side of the touch panel 120; however, the electronic apparatus 100 of the first embodiment is not limited to this configuration. For example, the LRA 140 may be disposed close to the substrate 150 disposed inside the housing 110.

Figure 24:
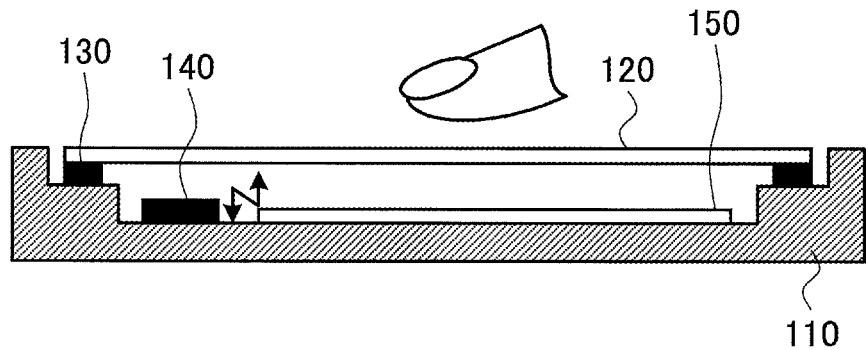
FIG. 24 is a diagram illustrating an example of an electronic apparatus in which the LRA is disposed on a housing.

FIG. 24 is a diagram illustrating an example of an electronic apparatus in which the LRA 140 is disposed on a housing. In the electronic apparatus 100A illustrated in FIG. 24, the LRA 140 is disposed close to the substrate 150 inside the housing 110. The first embodiment may also be applied to the electronic apparatus 100A. In addition, when the first embodiment is applied to the electronic apparatus 100A, click feeling at the time of pressing a metal dome button 2 may be represented in a manner similar to the electronic apparatus 100 of the first embodiment.

Second Embodiment

The following illustrates a second embodiment with reference to the accompanying drawings. The second embodiment describes an example in which the resonant frequency f0 is measured in a configuration in which the LRA 140 is incorporated in the electronic apparatus 100. The illustration of the second embodiment merely describes a difference from the first embodiment. Further, components of the second embodiment having functions similar to the components of the first embodiment are provided with the same reference numbers as those used in the first embodiment, and a duplicated illustration is thus omitted from the specification.

In the second embodiment, the resonant frequency 0' of the touch panel 120 is measured in a configuration of the electronic apparatus 100 that incorporates the LRA 140. Further, in the second embodiment, the resonant frequency 0' is used to calculate a frequency f1 of the drive signal F.

Figure 25:
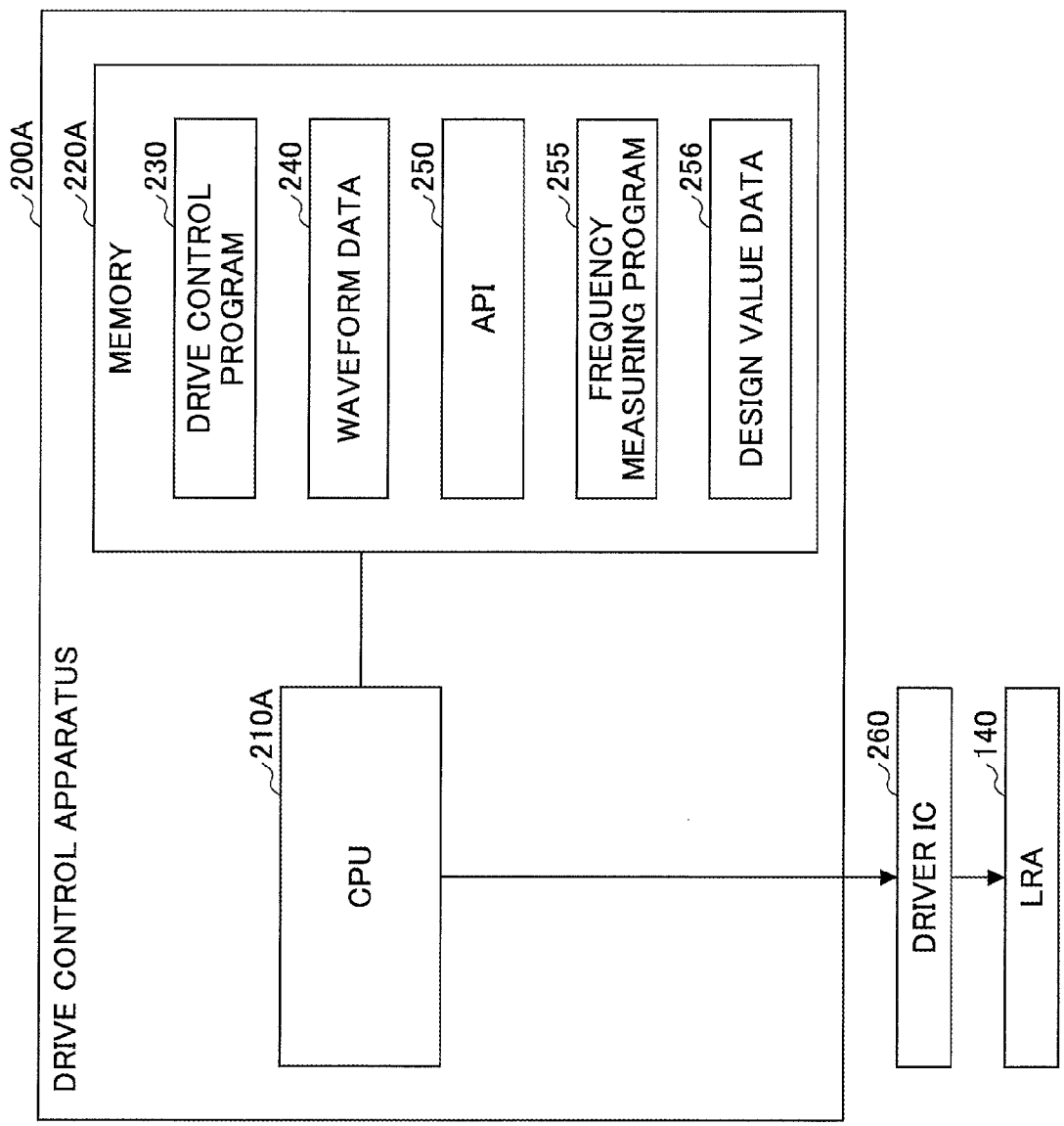
FIG. 25 is a diagram illustrating a drive control apparatus of a second embodiment.

FIG. 25 is a diagram illustrating a drive control apparatus of the second embodiment. The drive control apparatus 200A of the second embodiment includes a CPU (central processing unit) 210A, and a memory 220A.

The CPU 210A reads the later-described frequency measuring program 255 from the memory 220A, and executes the read frequency measuring program 255 to measure and reset the later-described resonant frequency f0'.

The memory 220A stores the frequency measuring program 255, and design value data 256 in addition to the drive control program 230, the waveform data 240, and the API 250.

The frequency measuring program 255 includes commands to cause the CPU 210A to execute a measuring process of the resonant frequency f0' of the LRA 140 in a configuration of the electronic apparatus 100 that may, for example, incorporate the LRA 140. The design value data 266 are predetermined when the electronic apparatus 100 is designed. The design value data 256 of the second embodiment may be a resonant frequency f0' unique to the LRA 140, for example.

The following describes the measurement of the resonant frequency 0' in the second embodiment.

Figure 26:
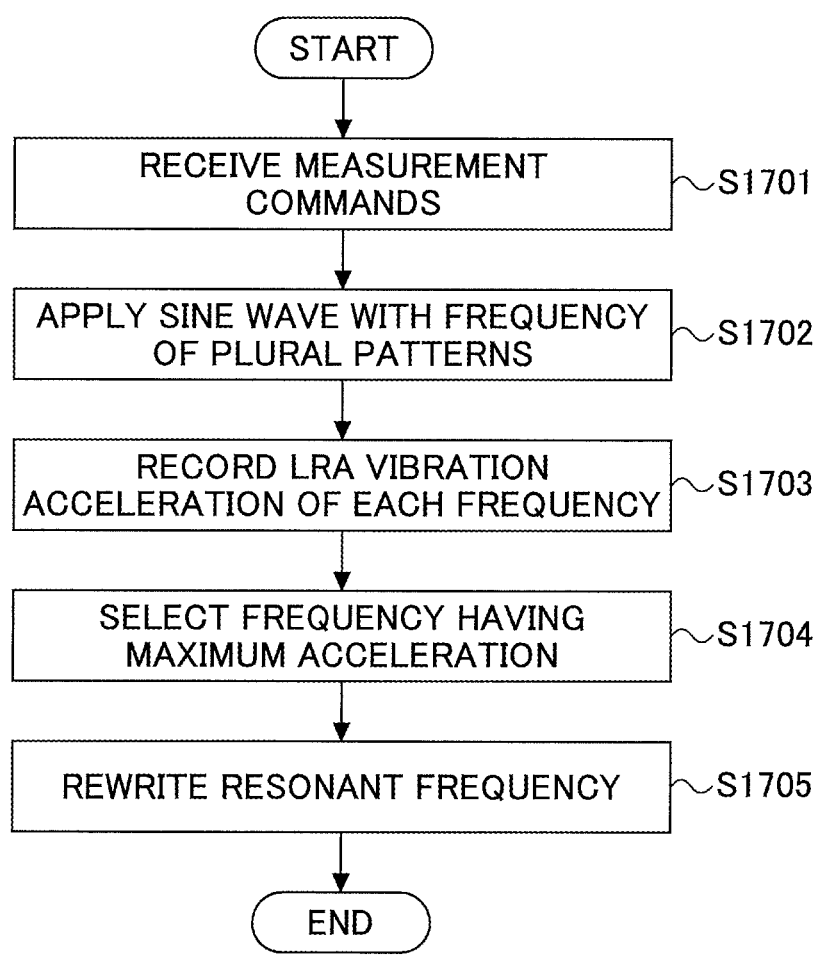
FIG. 26 is a flowchart illustrating a measuring process of a resonant frequency in the second embodiment.

FIG. 26 is a flowchart illustrating a measuring process of the resonant frequency in the second embodiment.

In the second embodiment, when commands for measuring the resonant frequency f0' are supplied to the electronic apparatus 100 (step S1701), the CPU 210A reads the frequency measuring program 255. In the second embodiment, the commands for measuring the resonant frequency f0' may be supplied at a time at which a process of incorporating the LRA 140 and the touch panel 120 into the housing 110 or at the time of shipping in a production process of the electronic apparatus 100.

The frequency measuring program 255 causes the CPU 210A to supply the sine wave of frequencies to the LRA 140 as the drive signal in a predetermined frequency band (step S1702). Specifically, the CPU 210A may, for example, supply the drive signal to the LRA 140 such as a sine wave having a frequency of 100 Hz, a sine wave having a frequency of 110 Hz, ... , a sine wave having a frequency of 290 Hz, and a sine wave having a frequency of 300 Hz in a frequency band range of 100 to 300 Hz.

The frequency measuring program 255 causes the CPU 210A to store in the memory 220A the maximum value of the acceleration of the vibration of the touch panel 120 for each of the drive signals having different frequencies (step S1703). Specifically, the electronic apparatus 100 includes a not-illustrated built-in accelerometer, and detects the maximum value of the acceleration of the vibration of the touch panel 120 every time the drive signal having a different frequency is supplied to the LRA 140. The memory 220A is provided with an area storing computational results obtained by the frequency measuring program 255, and temporarily stores the maximum value of the acceleration for each of the drive signals.

Subsequently, the frequency measuring program 255 causes the CPU 210A to select a frequency of the drive signal obtaining the maximum value of the acceleration from those stored in the memory 220A (step S1704). Subsequently, the frequency measuring program 255 causes the CPU 210A to determine the selected frequency of the drive signal as the resonant frequency f0′, and overwrite the design value data 256 of the memory 220A with the resonant frequency f0′ (step S1075).

In the second embodiment, this process changes the resonant frequency f0 to the resonant frequency f0′. Accordingly, in the second embodiment, the frequency f1 of the drive signal for controlling the residual vibration is $f1=(m/n) \times f0'$.

Accordingly, when the vibrations of the touch panel 120 or the housing 110 are superimposed on the LRA 140, the drive signal f1 may be calculated based on the resonant frequency 0′ of the touch panel 120 that is directly touched by the user's fingers. Hence, the present embodiment directly provides the tactile sense of the short-time waveform representing the rapid damping with respect to the user within one to several periods to present the clicking sense.

Note that in this embodiment, the resonant frequency f0′ is measured by the frequency measuring program 255; however, the resonant frequency f0′ may be measured outside the electronic apparatus 100, and the design value data 256 of the memory 220A may be overwritten with the measured resonant frequency f0′.

Further, the present embodiment may also be applied to the electronic apparatus 100A.

The examples and embodiments of the drive control apparatus, the electronic apparatus, the non-transitory recording medium storing the drive control program have been described above in detail; however, it should not be construed that the present invention is limited to those specific examples and embodiments described above. Various changes or alternations may be made within the scope of the invention.

The disclosed technology may provide the tactile sense according to operations.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A drive control apparatus comprising:
 a storage configured to store one of first waveform data and second waveform data,
  the first waveform data representing a first drive signal applying vibration m×Q times, where Q is a natural number other than 0, to an actuator, the first drive signal being obtained by multiplying a sine wave by a damping ratio of a vibration system implementing the actuator, the sine wave satisfying a frequency $f1=(m/n) \times f0$, where m and n are mutually different natural numbers other than 0,
  the second waveform data representing a second drive signal applying a vibration (m/2)×Q times, where Q is a natural number other than 0, to the actuator, the second drive signal being obtained by multiplying a sine wave by a damping ratio of the vibration system implementing the actuator, the sine wave satisfying a frequency $f1=(m/n) \times f0$, where m and n are mutually different positive odd numbers,
  wherein f0 represents a resonant frequency of the actuator; and
 a drive controller configured to read one of the first waveform data and the second waveform data stored in the storage, and drive the actuator in response to one of the first drive signal and the second drive signal represented by the read one of the first waveform data and the second waveform data,
 wherein the m, the n and the Q are numbers that reduce a residual vibration of the actuator to a level less than or equal to 0.02 G within 0.02 seconds after the drive controller has stopped reading the read one of the first waveform data and the second waveform data and stopped driving the actuator.

2. The drive control apparatus as claimed in claim 1, wherein the frequency f1 satisfies $f1=(m/n) \times f0$, where m and n are natural numbers other than 0, and m>n.

3. An electronic apparatus comprising:
 a touch panel;
 an actuator having a resonant frequency f0 and configured to vibrate the touch panel; and
 a drive control apparatus including
  a storage configured to store one of first waveform data and second waveform data,
   the first waveform data representing a first drive signal applying vibration m×Q times, where Q is a natural number other than 0, to an actuator, the first drive signal being obtained by multiplying a sine wave by a damping ratio of a vibration system implementing the actuator, the sine wave satisfying a frequency $f1=(m/n) \times f0$, where m and n are mutually different natural numbers other than 0,
   the second waveform data representing a second drive signal applying a vibration (m/2)×Q times, where Q is a natural number other than 0[D]k to the actuator, the second drive signal being obtained by multiplying a sine wave by a damping ratio of the vibration system implementing the actuator, the sine wave satisfying a frequency $f1=(m/n) \times f0$, where m and n are mutually different positive odd numbers,
  wherein f0 represents a resonant frequency of the actuator; and
  a drive controller configured to read one of the first waveform data and the second waveform data stored in the storage, and drive the actuator in response to one of the first drive signal and the second drive signal represented by the read one of the first waveform data and the second waveform data,
  wherein the m, the n and the Q are numbers that reduce a residual vibration of the actuator to a level less than or equal to 0.02 G within 0.02 seconds after the drive controller has stopped reading the read one of the first waveform data and the second waveform data and stopped driving the actuator.

4. The electronic apparatus as claimed in claim 3, wherein the storage stores data representing the resonant frequency f0 of the actuator, the electronic apparatus further comprising:

a storage controller configured to apply to the actuator a plurality of the first drive signals having different first frequencies in predetermined bands and a plurality of the second drive signals having different second frequencies in predetermined bands, and store data representing a maximum vibration acceleration of the touch panel for each of the first drive signals and each of the second drive signals in the storage; and a rewrite controller configured to rewrite the data representing the resonant frequency f0 of the actuator stored in the storage with data representing the frequency of one of the first drive signal and the second drive signal corresponding to the maximum acceleration among the stored accelerations.

5. A non-transitory computer-readable recording medium storing a program, wherein when processed by processors, causes a computer to perform processes, the processes comprising:

reading one of first waveform data and second waveform data, the first waveform data representing a first drive signal applying vibration m×Q times, where Q is a natural number other than 0, to an actuator, the first drive signal being obtained by multiplying a sine wave by a damping ratio of a vibration system implementing the actuator, the sine wave satisfying a frequency $f1=(m/n)\times f0$, where m and n are mutually different natural numbers other than 0, the second waveform data representing a second drive signal applying a vibration (m/2)×Q times, where Q is a natural number other than 0, to the actuator, the second drive signal being obtained by multiplying a sine wave by a damping ratio of the vibration system implementing the actuator, the sine wave satisfying a frequency $f1=(m/n)\times f0$, where m and n are mutually different positive odd numbers, wherein f0 represents a resonant frequency of the actuator; and driving the actuator in response to one of the first drive signal and the second drive signal represented by the read one of the first waveform data and the second waveform data, wherein the m, the n and the Q are numbers that reduce a residual vibration of the actuator to a level less than or equal to 0.02 G within 0.02 seconds after the drive controller has stopped reading the read one of the first waveform data and the second waveform data and stopped driving the actuator.

6. A drive control method performed by a computer, the drive control method comprising:

reading one of first waveform data and second waveform data, the first waveform data representing a first drive signal applying vibration m×Q times, where Q is a natural number other than 0, to an actuator, the first drive signal being obtained by multiplying a sine wave by a damping ratio of a vibration system implementing the actuator, the sine wave satisfying a frequency $f1=(m/n)\times f0$, where m and n are mutually different natural numbers other than 0, the second waveform data representing a second drive signal applying a vibration (m/2)×Q times, where Q is a natural number other than 0, to the actuator, the second drive signal being obtained by multiplying a sine wave by a damping ratio of the vibration system implementing the actuator, the sine wave satisfying a frequency $f1=(m/n)\times f0$, where m and n are mutually different positive odd numbers, wherein f0 represents a resonant frequency of the actuator; and driving the actuator in response to one of the first drive signal and the second drive signal represented by the read one of the first waveform data and the second waveform data, wherein the m, the n and the Q are numbers that reduce a residual vibration of the actuator to a level less than or equal to 0.02 G within 0.02 seconds after the drive controller has stopped reading the read one of the first waveform data and the second waveform data and stopped driving the actuator.

* * * * *